(12) United States Patent
Miyaki et al.

(10) Patent No.: US 12,126,203 B2
(45) Date of Patent: Oct. 22, 2024

(54) CHARGING DEVICE, CHARGING METHOD, SECONDARY BATTERY, BATTERY PACK, ELECTRIC VEHICLE, POWER STORAGE DEVICE, ELECTRONIC DEVICE, AND POWER STORAGE SYSTEM USING SOC

(71) Applicant: MURATA MANUFACTURING CO., LTD., Kyoto (JP)

(72) Inventors: Yukio Miyaki, Kyoto (JP); Sho Takahashi, Kyoto (JP); Takahisa Ishimatsu, Kyoto (JP); Takahiro Shirai, Kyoto (JP); Takamasa Ono, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 580 days.

(21) Appl. No.: 16/600,090

(22) Filed: Oct. 11, 2019

(65) Prior Publication Data
US 2020/0039376 A1     Feb. 6, 2020

Related U.S. Application Data

(63) Continuation of application No. PCT/JP2018/014706, filed on Apr. 6, 2018.

(30) Foreign Application Priority Data

Apr. 14, 2017   (JP) ................. 2017-080396

(51) Int. Cl.
*H02J 7/00* (2006.01)
*B60L 50/60* (2019.01)
(Continued)

(52) U.S. Cl.
CPC ............ *H02J 7/0048* (2020.01); *B60L 50/60* (2019.02); *B60L 53/62* (2019.02); *B60L 58/12* (2019.02);
(Continued)

(58) Field of Classification Search
CPC .......... B60L 53/62; B60L 58/12; B60L 50/60; H01M 10/44; H01M 10/48; H02J 7/00;
(Continued)

(56) References Cited

U.S. PATENT DOCUMENTS

2011/0006733 A1\*  1/2011  Tatebayashi ...... H02J 7/007182
                                                           320/116
2011/0112782 A1\*  5/2011  Majima ................ H02J 7/0029
                                                           324/427
(Continued)

FOREIGN PATENT DOCUMENTS

CN     102948036 A  \*  2/2013  ............ H01M 10/44
CN     104471778 A  \*  3/2015  ........... H01M 10/052
(Continued)

OTHER PUBLICATIONS

International Search Report and Written Opinion issued in connection with PCT Application No. PCT/JP2018/014706, mailed May 1, 2018. (8 pages).

(Continued)

*Primary Examiner* — Richard Isla
*Assistant Examiner* — Manuel Hernandez
(74) *Attorney, Agent, or Firm* — K&L Gates LLP

(57) ABSTRACT

A charging device is provided. The charging device switches to a (n+1)-th charging rate from a n-th charging rate when constant current charging is performed on a secondary battery at the n-th charging rate, at an SOC smaller than an SOC at which a voltage local minimum value appears when an experimental battery is charged at the n-th charging rate. The (n+1)-th charging rate is lower than the n-th charging rate, and n is a natural number.

5 Claims, 15 Drawing Sheets

(51) Int. Cl.
*B60L 53/62* (2019.01)
*B60L 58/12* (2019.01)
*H01M 10/44* (2006.01)
*H01M 10/48* (2006.01)
*B60K 6/28* (2007.10)

(52) U.S. Cl.
CPC .......... *H01M 10/44* (2013.01); *H01M 10/48* (2013.01); *H02J 7/007* (2013.01); *H02J 7/0071* (2020.01); *H02J 7/00712* (2020.01); *H02J 7/007182* (2020.01); *H02J 7/007184* (2020.01); *B60K 6/28* (2013.01); *B60Y 2200/91* (2013.01); *B60Y 2200/92* (2013.01); *B60Y 2300/91* (2013.01); *B60Y 2400/112* (2013.01)

(58) Field of Classification Search
CPC .......... H02J 7/007; H02J 3/383; H02J 7/0048; H02J 7/007184; G01R 31/382; B60K 6/28; B60Y 2200/91; B60Y 2300/91; B60Y 2400/112; B60Y 2200/92; H02K 11/0094
USPC ............................................. 429/96; 320/160
See application file for complete search history.

(56) References Cited

U.S. PATENT DOCUMENTS

| | | | | |
|---|---|---|---|---|
| 2012/0293126 A1* | 11/2012 | Nakamoto | ............ | H01M 4/505 320/160 |
| 2013/0069584 A1* | 3/2013 | Nagakura | ......... | H02J 7/007182 320/162 |
| 2014/0239908 A1* | 8/2014 | Ichikawa | .............. | H02J 7/0016 320/134 |
| 2015/0050535 A1* | 2/2015 | Amiruddin | ....... | H01M 10/0525 429/188 |
| 2015/0069976 A1* | 3/2015 | Yamanaka | .......... | H02J 7/00714 320/164 |
| 2016/0006272 A1* | 1/2016 | Greening | ............ | H02J 7/00041 320/162 |
| 2016/0020620 A1* | 1/2016 | Lee | ................... | H02J 7/007182 320/162 |
| 2016/0190843 A1* | 6/2016 | Yang | ....................... | H02J 7/007 320/152 |
| 2016/0207403 A1* | 7/2016 | Iida | ........................ | B60L 50/16 |
| 2016/0301225 A1* | 10/2016 | Shiraishi | ............ | H01M 10/443 |
| 2017/0141366 A1* | 5/2017 | Inakawa | ........... | H01M 50/503 |
| 2017/0310137 A1* | 10/2017 | Ha | ............................ | H02J 7/04 |
| 2018/0292461 A1* | 10/2018 | Kim | ........................ | H02J 7/00 |

FOREIGN PATENT DOCUMENTS

| | | | | |
|---|---|---|---|---|
| CN | 105047910 A | * | 11/2015 | ........ H01M 10/0525 |
| JP | 2011-182479 A | | 9/2011 | |
| JP | 2012-210113 A | | 10/2012 | |
| JP | 2013-054939 A | | 3/2013 | |
| JP | 2013-089363 A | | 5/2013 | |
| JP | 2014-117081 A | | 6/2014 | |
| JP | 2015-186316 A | | 10/2015 | |
| KR | 20180033899 A | * | 4/2018 | |
| WO | WO-2011152062 A1 | * | 12/2011 | ............ H01M 10/44 |
| WO | WO-2015190018 A1 | * | 12/2015 | ............... B60K 1/04 |
| WO | 2016/068463 A2 | | 5/2016 | |
| WO | WO-2016079964 A1 | * | 5/2016 | ....... G01R 19/16542 |
| WO | 2017030309 | | 2/2017 | |

OTHER PUBLICATIONS

Japanese Office Action issued May 26, 2020 in corresponding Japanese Application No. 2019-512489.
European Search Report issued Dec. 7, 2020 in corresponding European Application No. 18784241.4.
European Office issued May 16, 2022 in corresponding European Application No. 18 784 241.4.

* cited by examiner

CHARGING DEVICE, CHARGING METHOD, SECONDARY BATTERY, BATTERY PACK, ELECTRIC VEHICLE, POWER STORAGE DEVICE, ELECTRONIC DEVICE, AND POWER STORAGE SYSTEM USING SOC

CROSS REFERENCE TO RELATED APPLICATIONS

The present application is a continuation of PCT patent application no. PCT/JP2018/014706, filed on Apr. 6, 2018, which claims priority to Japanese patent application no. JP2017-080396 filed on Apr. 14, 2017, the entire contents of which are being incorporated herein by reference.

BACKGROUND

The present technology generally relates to a lithium ion secondary battery having a laminate film as an exterior body, and a charging device, a charging method, a secondary battery, a battery pack, an electric vehicle, a power storage device, an electronic device, and a power storage system that can prevent deterioration of the battery without prolonging charging time.

In recent years, many portable devices such as mobile phones or tablet computers, small power tools, and the like have appeared, and their miniaturization, weight reduction, and shortening of charging time have been desired. Along with this, the demand for batteries used as a power source for portable devices is rapidly expanding, and lithium ion secondary batteries using a laminate film are suitable as batteries satisfying such requirements.

It is known that the capacity of a lithium ion secondary battery gradually decreases due to repeated charging and discharging. It is known that the capacity deterioration not only increases on the higher temperature side which is higher than room temperature but also increases on the lower temperature side lower than room temperature. Furthermore, it is known that, as the charging current becomes larger, deterioration becomes larger. Although this deterioration phenomenon can be suppressed if the charging current is reduced, there is a drawback that the charging time becomes long, and a charging method capable of achieving both long life and short charging time has been strongly desired.

SUMMARY

The present technology generally relates to a lithium ion secondary battery having a laminate film as an exterior body, and a charging device, a charging method, a secondary battery, a battery pack, an electric vehicle, a power storage device, an electronic device, and a power storage system that can prevent deterioration of the battery without prolonging charging time.

Although various charging methods have been proposed for prolonging the life of the battery, it has been insufficient to simultaneously achieve both long life and short charging time.

The present technology proposes a charging device, a charging method, a secondary battery, a battery pack, an electric vehicle, a power storage device, an electronic device, and a power storage system that are capable of achieving both long life and short charging time.

According to an embodiment of the present disclosure, a charging device is provided. The charging device switches to a (n+1)-th charging rate from a n-th charging rate when constant current charging is performed on a secondary battery at the n-th charging rate, at an SOC smaller than an SOC at which a voltage local minimum value appears when an experimental battery is charged at the n-th charging rate. The (n+1)-th charging rate is lower than the n-th charging rate, and n is a natural number.

Further, according to an embodiment of the present disclosure, a charging method is provided. The charging method including switching a secondary battery to a (n+1)-th charging rate from a n-th charging rate when constant current charging is performed on a secondary battery at the n-th charging rate, at an SOC smaller than an SOC at which a voltage local minimum value appears when an experimental battery including a negative electrode and a metal lithium electrode is charged at the n-th charging rate. The (n+1)-th charging rate is lower than the n-th charging rate, and n is a natural number.

Further, the present technology includes a secondary battery charged by the charging device as described herein.

Further, the present technology includes a battery pack configured to be charged with the charging device as described herein includes a secondary battery, and an exterior housing configured to accommodate the secondary battery.

Further, the present technology includes an electric vehicle including a converter configured to receive supply of power from a secondary battery and convert the power into a driving force of the electric vehicle; and a controller configured to perform information processing related to vehicle control based on information related to the secondary battery.

Further, the present technology includes a power storage device including the charging device as described herein; and a secondary battery, in which the power storage device is configured to supply power to an electronic device connected to the secondary battery.

Further, the present technology includes an electronic device including the secondary battery as described herein, in which the electronic device is configured to receive supply of power from the secondary battery.

Further, the present technology includes a power storage system including the charging device; and the secondary battery as described herein, in which the power storage system is configured to receive supply of power from the secondary battery.

The present technology makes it possible to extend the life of the battery while keeping the charging time short. In addition, the effect described here is not necessarily limited, and may be any effect described in the present technology or an effect different from them. In addition, the contents of the present technology are not interpreted as being limited by the effects described in the following description and other suitable properties relating to the present technology may be realized and as further described.

DETAILED DESCRIPTION

As described herein, the present disclosure will be described based on examples with reference to the drawings, but the present disclosure is not to be considered limited to the examples, and various numerical values and materials in the examples are considered by way of example.

A laminate film type battery to which the present technology can be applied is described.

Figures 1A, 1B, 1C:
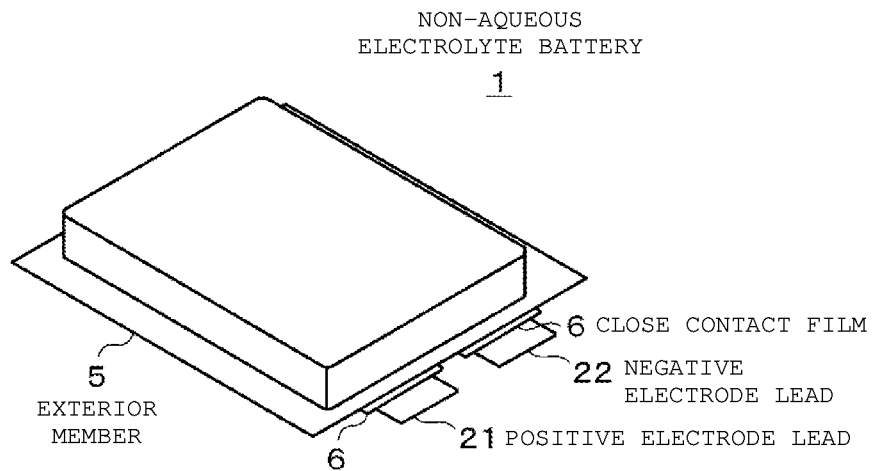
FIGS. 1A-1C are exploded perspective views illustrating a configuration of an example of a laminate film type non-aqueous electrolyte battery according to an embodiment of the present disclosure.

FIGS. 1A-1C illustrate configurations of such a non-aqueous electrolyte battery. The non-aqueous electrolyte battery is a so-called laminate film type, in which a laminated electrode body 20 to which a positive electrode lead 21 and a negative electrode lead 22 are attached is accommodated inside a film-like exterior member 5.

The positive electrode lead 21 and the negative electrode lead 22 are respectively derived from the inside to the outside of the exterior member 5, for example, in the same direction. The positive electrode lead 21 and the negative electrode lead 22 are each made of, for example, a metal material such as aluminum (Al), copper (Cu), nickel (Ni), stainless steel (SUS), or the like, and each have a thin plate shape or a mesh shape.

The exterior member 5 is made of, for example, a laminate film in which resin layers are formed on both sides of a metal layer. In the laminate film, an outer resin layer is formed on the surface of the metal layer exposed to the outside of the battery, and inner resin layers are formed on the inner surface of the battery facing a power generating element such as the laminated electrode body 20.

The metal layer plays the most important role of preventing entry of moisture, oxygen, and light and protecting the contents, and aluminum or stainless steel is preferable in terms of lightness, extensibility, cost, and ease of processing.

The outer resin layer has a beautiful appearance, toughness, flexibility, and the like, and a resin material such as nylon or polyethylene terephthalate (PET) is used. Since the inner resin layers are portions that melt and fused to each other with heat or an ultrasonic wave, a polyolefin resin is suitable, and a cast polypropylene (CPP) film is often used. An adhesive layer may be provided as needed between the metal layer and the outer resin layer and between the metal layer and the inner resin layer.

The exterior member 5 is provided with a recess for accommodating the laminated electrode body 20, which is formed, for example, by deep drawing from the inner resin layer side in a direction toward the outer resin layer, and the inner resin layers are arranged to face the laminated electrode body 20. The opposing inner resin layers of the exterior member 5 are in close contact with each other by fusion or the like at the outer edge portion of the recess. Close contact films 6 are arranged between the exterior member 5 and the positive electrode lead 21 and between the exterior member 5 and the negative electrode lead 22 for improving the adhesion between the inner resin layers of the exterior member 5 and the positive electrode lead 21 made of a metal material and between the inner resin layers of the exterior member 5 and the negative electrode lead 22. The close contact films 6 are each made of a resin material having high adhesiveness to a metal material, and is made of, for example, polyethylene, polypropylene, or a polyolefin resin such as modified polyethylene or modified polypropylene obtained by modifying these materials.

The exterior member 5 may be made of a laminate film having another structure, a polymer film such as polypropylene, or a metal film instead of a laminate film in which the metal layer is made of aluminum or stainless steel.

A positive electrode 23 has a structure in which a positive electrode active material layer is provided on one surface or both surfaces of a positive electrode current collector.

The positive electrode 23 is obtained by forming positive electrode active material layers containing a positive electrode active material on both surfaces of a positive electrode current collector. As the positive electrode current collector, for example, metal foil such as aluminum foil, nickel foil, or stainless steel foil can be used.

The positive electrode active material layer contains, for example, a positive electrode active material, a conductive agent, and a binder. As the positive electrode active material, any one or two or more of positive electrode materials capable of occluding and releasing lithium can be used, and as necessary, other materials such as a binder and a conductive agent can be used.

As the positive electrode material capable of occluding and releasing lithium, for example, a lithium-containing compound is preferable. This is because high energy density can be obtained. Examples of the lithium-containing compound include a composite oxide containing lithium and a transition metal element, and a phosphoric acid compound containing lithium and a transition metal element. Among them, those containing at least one selected from the group consisting of cobalt (Co), nickel (Ni), manganese (Mn), and iron (Fe) as a transition metal element are preferable. This is because a higher voltage can be obtained.

As the positive electrode material, for example, a lithium-containing compound represented by $Li_xM1O_2$ or $Li_yM2PO_4$ can be used. In the formula, M1 and M2 represent one or more transition metal elements. The values of x and y vary depending on the charging/discharging state of the battery, and usually, $0.05 \leq x \leq 1.10$, and $0.05 \leq y \leq 1.10$. Examples of the composite oxide containing lithium and a transition metal element include a lithium cobalt composite oxide ($Li_xCoO_2$), a lithium nickel composite oxide ($LiXNiO_2$), a lithium nickel cobalt composite oxide ($Li_xNi_{1-z}Co_zO_2$ (0<z<1)), a lithium nickel cobalt manganese composite oxide ($Li_xNi_{(1-v-w)}Co_vMn_wO_2$ (0<v+w<1, v>0, w>0)), a lithium manganese composite oxide ($LiMn_2O_4$) having a spinel structure, and a lithium manganese nickel composite oxide ($LiMn_{2-t}Ni_tO_4$ (0<t<2)). Among them, a composite oxide containing cobalt, a composite oxide containing cobalt, nickel, and manganese, or a composite oxide containing cobalt, nickel, and aluminum are preferred. This is because a high capacity can be obtained and also excellent cycle characteristics can be obtained. Further, examples of the phosphoric acid compound containing lithium and a transition metal element include a lithium iron phosphoric acid compound ($LiFePO_4$) and a lithium iron manganese phosphoric acid compound ($LiFe_{1-u}Mn_uPO_4$ (0<u<1)).

Furthermore, also from the viewpoint of obtaining higher electrode filling properties and cycle characteristics, a composite grain in which a surface of the grain made of any of the above lithium-containing compounds is covered with fine grains made of any of the other lithium-containing compounds may be used.

Besides, examples of the positive electrode material capable of occluding and releasing lithium include oxides such as vanadium oxide ($V_2O_5$), titanium dioxide ($TiO_2$), and manganese dioxide ($MnO_2$), disulfides such as iron disulfide ($FeS_2$), titanium disulfide ($TiS_2$), and molybdenum disulfide ($MoS_2$), chalcogenide not containing lithium such as niobium diselenide ($NbSe_2$) (especially a layered compound and a spinel compound), a lithium-containing compound containing lithium, and conductive polymers such as sulfur, polyaniline, polythiophene, polyacetylene, and polypyrrole. As a matter of course, the positive electrode material capable of occluding and releasing lithium may be other than those described above. Moreover, two or more of the above-mentioned series positive electrode materials may be mixed by any combinations.

As the conductive agent, for example, a carbon material such as carbon black or graphite is used. As the binder, a resin material such as polyvinylidene fluoride (PVdF), polytetrafluoroethylene (PTFE), polyacrylonitrile (PAN), styrene butadiene rubber (SBR), or carboxymethyl cellulose (CMC), and at least one selected from copolymers containing these resin materials as a main component are used.

The positive electrode 23 includes the positive electrode lead 21 connected to one end of the positive electrode current collector by spot welding or ultrasonic welding. The positive electrode lead 21 is desirably metal foil and has a mesh shape, but there is no problem even if it is not metal as long as it is electrochemically and chemically stable and can be conducted. Examples of the material of the positive electrode lead 21 include aluminum (Al) and nickel (Ni).

The negative electrode 24 has a structure in which a negative electrode active material layer is provided on one surface or both surfaces of a negative electrode current collector, and the negative electrode active material layer and the positive electrode active material layer are arranged to face each other.

It should be understood that the negative electrode active material layer may be provided only on one surface of the negative electrode current collector. The negative electrode current collector is made of, for example, metal foil such as copper foil.

The negative electrode active material layer contains any one or two or more of negative electrode materials capable of occluding and releasing lithium as the negative electrode active material, and as necessary, may contain other materials such as a binder and a conductive agent similarly to the positive electrode active material layer.

The electrochemical equivalent of the negative electrode material capable of occluding and releasing lithium is larger than the electrochemical equivalent of the positive electrode 23, and theoretically, lithium metal is not deposited on the negative electrode 24 during charging.

Examples of the negative electrode material capable of occluding and releasing lithium include carbon materials such as non-graphitizable carbon, graphitizable carbon, graphite, pyrolytic carbons, cokes, glassy carbons, an organic polymer compound fired body, carbon fiber, and activated carbon. Among these, cokes include pitch coke, needle coke, and petroleum coke. The organic polymer compound fired body is a material obtained by firing and carbonizing a polymer material such as a phenol resin or a furan resin at an appropriate temperature, and in part, is classified as non-graphitizable carbon or graphitizable carbon. These carbon materials are preferable because they have very little change in the crystal structure generated at the time of charging and discharging, can obtain high charging and discharging capacity, and can obtain good cycle characteristics. In particular, graphite is preferable because it has a large electrochemical equivalent and high energy density can be obtained. Further, non-graphitizable carbon is preferable because excellent cycle characteristics can be obtained. Furthermore, one having a low charging/discharging potential, specifically one having a charging/discharging potential close to that of lithium metal is preferable because high energy density of the battery can be easily realized.

Examples of another negative electrode material capable of occluding and releasing lithium and capable of increasing the capacity also include a material capable of occluding and releasing lithium and containing at least one of a metal element and a semimetal element as a constituent element. This is because, with such a material, high energy density can be obtained. In particular, when it is used together with a carbon material, high energy density can be obtained, and excellent cycle characteristics can be obtained, which is more preferable. The negative electrode material may be a simple substance, an alloy, or a compound of a metal element or a semimetal element, or may have at least one or two or more of these phases in part. In the present technology, the alloy include alloys containing one or more metal elements and one or more semimetal elements in addition to an alloy containing two or more metal elements. Moreover, the alloy may contain a nonmetallic element. The structure includes a solid solution, a eutectic (eutectic mixture), an intermetallic compound, or a mixture of two or more of them.

Examples of the metal element or the semimetal element which constitutes this negative electrode material include a metal element or a semimetal element which can form an alloy with lithium. Specifically, there are given aluminum (Al), indium (In), silicon (Si), germanium (Ge), tin (Sn), lead (Pb), bismuth (Bi), cadmium (Cd), silver (Ag), zinc (Zn), palladium (Pd) or platinum (Pt). These may be crystalline or amorphous.

Examples of the negative electrode material include lithium titanate ($Li_4Ti_5O_{12}$). The negative electrode material preferably contains a metal element or semimetal element of the group 4B in the short period periodic table as a constituent element, more preferably contains at least one of silicon (Si) and tin (Sn) as a constituent element, and particularly preferably contains at least silicon. This is because silicon (Si) and tin (Sn) have a large ability to occlude and release lithium and can obtain high energy density. Examples of the negative electrode material containing at least one of silicon and tin include a simple substance, an alloy, or a compound of silicon, a simple substance, an alloy, or a compound of tin, and a material having at least one or two or more of these phases in part.

Examples of the alloy of silicon include one containing at least one selected from the group consisting of tin (Sn), nickel (Ni), copper (Cu), iron (Fe), cobalt (Co), manganese (Mn), zinc (Zn), indium (In), silver (Ag), titanium (Ti), germanium (Ge), bismuth (Bi), antimony (Sb), and chromium (Cr) as a second constituent element other than silicon. Examples of the alloy of tin include one containing at least one selected from the group consisting of silicon (Si), nickel (Ni), copper (Cu), iron (Fe), cobalt (Co), manganese (Mn), zinc (Zn), indium (In), silver (Ag), titanium (Ti), germanium (Ge), bismuth (Bi), antimony (Sb), and chromium (Cr) as a second constituent element other than tin (Sn).

Examples of the compound of tin (Sn) or the compound of silicon (Si) include one containing oxygen (O) or carbon (C), and in addition to tin (Sn) or silicon (Si), they may contain the second constituent elements described above. Preferably they are SiO or $SnSiO_3$.

As the resin material constituting the separator 25, it is preferable to use, for example, a polyolefin resin such as polypropylene or polyethylene, an acrylic resin, a styrene resin, a polyester resin, a nylon resin, or the like In particular, polyolefin resins such as polyethylenes such as low density polyethylene, high density polyethylene, and linear polyethylene, low molecular weight wax components thereof, and polypropylene are suitably used because they have suitable melting temperatures and are easy to obtain. In addition, a structure in which two or more of porous membranes are laminated, or a porous membrane formed by melt-kneading two or more types of resin materials may be used. One including the porous membrane containing a polyolefin resin is excellent in the separation nature of the positive electrode 23 and the negative electrode 24, and can further reduce the reduction of an internal short circuit.

The thickness of the separator 25 can be freely set as long as it is larger than a thickness that can maintain the required strength and the insulation between the positive electrode 23 and the negative electrode 24. It is preferable that the separator 25 insulates between the positive electrode 23 and the negative electrode 24 to prevent short circuit and the like, has ion permeability for suitably performing a battery reaction through the separator 25, and is set to have a thickness that can increase a volumetric efficiency of the active material layer that contributes to the battery reaction in the battery to the extent possible. Specifically, the thickness of the separator 25 is preferably 5 µm or more and 20 µm or less.

The porosity of the separator 25 is preferably 25% or more and 80% or less, and more preferably 25% or more and 40% or less, in order to obtain the ion permeability described above. Although depending on the current value at the time of actual use of the battery, and the characteristics and thickness of the pore structure of the separator 25, etc., if the porosity is smaller than the above range, the movement of ions in the non-aqueous electrolytic solution related to charging and discharging is interrupted. For this reason, the load characteristics decrease and it is difficult to take out a sufficient capacity at the time of large current discharging. In addition, when the porosity is increased out of the above range, the separator strength is reduced.

The electrolyte may be a gel electrolyte layer containing a non-aqueous electrolytic solution and a resin material to be a carrier that holds the non-aqueous electrolytic solution. In this case, the electrolyte is an ion conductor in which the polymer material is gelled by the non-aqueous electrolytic solution.

The electrolyte is formed between the positive electrode 23 and the negative electrode 24. The electrolyte can include solid grains such as inorganic grains or organic grains. The electrolyte may contain only a non-aqueous electrolytic solution without containing a resin material.

Hereinafter, the non-aqueous electrolytic solution and the resin material constituting the electrolyte is described.

The electrolyte salt contains, for example, one or two or more of light metal compounds such as lithium salt. Examples of the lithium salt include lithium hexafluorophosphate ($LiPF_6$), lithium tetrafluoroborate ($LiBF_4$), lithium perchlorate ($LiClO_4$), lithium hexafluoroarsenate ($LiAsF_6$), lithium tetraphenylborate ($LiB(C_6H_5)_4$), lithium methanesulfonate ($LiCH_3SO_3$), lithium trifluoromethanesulfonate ($LiCF_3SO_3$), lithium tetrachloroaluminate ($LiAlCl_4$), dilithium hexafluorosilicate ($Li_2SiF_6$), lithium chloride (LiCl), and lithium bromide (LiBr). Among them, at least one selected from the group consisting of lithium hexafluorophosphate, lithium tetrafluoroborate, lithium perchlorate, lithium hexafluoroarsenate is preferred, and lithium hexafluorophosphate is more preferred.

Examples of a non-aqueous solvent include lactone solvents such as γ-butyrolactone, γ-valerolactone, δ-valerolactone, and ε-caprolactone, carbonate ester solvents such as carbonate ethylene, carbonate propylene, carbonate butylene, carbonate vinylene, carbonate dimethyl, carbonate ethyl methyl, and diethyl carbonate, ether solvents such as 1,2-dimethoxyethane, 1-ethoxy-2-methoxyethane, 1,2-diethoxyethane, tetrahydrofuran, and 2-methyltetrahydrofuran, a nitrile solvent such as acetonitrile, a sulfolane solvent, phosphoric acids, a phosphoric acid ester solvent, and pyrrolidones. The solvents may be used alone or in combination of two or more.

In addition, it is more preferable to use a mixture of cyclic carbonate ester and chain carbonate ester as the non-aqueous solvent, and it is more preferable to contain a compound in which part or all of hydrogen of cyclic carbonate ester or chain carbonate ester is fluorinated. As the fluorinated compound, it is preferred to use fluoroethylene carbonate (4-fluoro-1,3-dioxolan-2-one: FEC) and difluoroethylene carbonate (4,5-difluoro-1,3-dioxolan-2-one: DFEC). This is because, even when the negative electrode 24 containing a compound such as silicon (Si), tin (Sn), or germanium (Ge) as the negative electrode active material is used, the charging/discharging cycle characteristics can be improved. Among them, difluoroethylene carbonate is preferably used as the non-aqueous solvent. This is because it is excellent in the cycle characteristic improvement effect.

As the resin material, as a matrix polymer compound, one having a property compatible with a solvent can be used. Examples of the resin material include resins whose at least one of a melting point and transition temperature is 180° C. or more, specifically, fluorine-containing resins such as polyvinylidene fluoride, and polytetrafluoroethylene, fluorine-containing rubbers such as vinylidene fluoride-tetrafluoroethylene copolymer, and ethylene-tetrafluoroethylene copolymer, styrene-butadiene copolymer and its hydride, acrylonitrile-butadiene copolymer and its hydride, acrylonitrile-butadiene-styrene copolymer and its hydride, methacrylic acid ester-acrylic acid ester copolymer, styrene-acrylic acid ester copolymer, acrylonitrile-acrylic acid ester copolymer, rubbers such as ethylene propylene rubber, polyvinyl alcohol, and polyvinyl acetate, cellulose derivatives such as ethyl cellulose, methyl cellulose, hydroxyethyl cellulose, and carboxymethyl cellulose, polyphenylene ether, polysulfone, polyethersulfone, polyphenylene sulfide, polyetherimide, polyimide, polyamide (especially aramid), polyamideimide, polyacrylonitrile, polyvinyl alcohol, polyether, acrylic acid resin, and polyester.

The electrolyte layer 10 can contain inorganic or organic solid grains.

Specific examples thereof include a metal oxide, a metal oxide hydrate, a metal hydroxide, a metal nitride, a metal carbide, and a metal sulfide, which are electrically insulating inorganic grains. As the metal oxide or the metal oxide hydrate, aluminum oxide (alumina, $Al_2O_3$), boehmite ($Al_2O_3H_2O$ or AlOOH), magnesium oxide (magnesia, MgO), titanium oxide (titania, $TiO_2$), zirconium oxide (zirconia, $ZrO_2$), silicon oxide (silica, $SiO_2$), yttrium oxide (yttria, $Y_2O_3$), zinc oxide (ZnO), or the like can be suitably used. As the metal nitride, silicon nitride ($Si_3N_4$), aluminum nitride (AlN), boron nitride (BN), titanium nitride (TiN), or the like can be suitably used. As the metal carbide, silicon carbide (SiC) or boron carbide ($B_4C$) can be suitably used. As the metal sulfide, a sulfate compound such as barium sulfate ($BaSO_4$) can be suitably used. As the metal hydroxide, aluminum hydroxide ($Al(OH)_3$) or the like can be used. Minerals such as silicate, barium titanate ($BaTiO_3$), strontium titanate ($SrTiO_3$), or the like may be used.

Further, lithium compounds such as $Li_2O_4$, $Li_3PO_4$, and LiF may be used. Carbon materials such as graphite, carbon nanotubes, and diamond may be used. Among them, alumina, boehmite, talc, titania (in particular, those having a rutile structure), silica, magnesia, and silicate minerals are preferably used, and alumina, boehmite, and silicate minerals are more preferably used.

These inorganic grains may be used alone or in combination of two or more. The inorganic grains also have oxidation resistance, and when the electrolyte layer is provided between the positive electrode 23 and the separator 25, the inorganic grains also have high resistance to the oxidizing environment in the vicinity of the positive electrode at the time of charging. The shape of the inorganic grains is not particularly limited, and any of spherical, fibrous, needle, scaly, plate and random shapes can be used.

Examples of the materials constituting the organic grains include resins having high heat resistance with at least one of a melting point and transition temperature of 180° C. or more, specifically, fluorine-containing resins such as polyvinylidene fluoride, and polytetrafluoroethylene, fluorine-containing rubbers such as vinylidene fluoride-tetrafluoroethylene copolymer, and ethylene-tetrafluoroethylene copolymer, styrene-butadiene copolymer or its hydride, acrylonitrile-butadiene copolymer or its hydride, acrylonitrile-butadiene-styrene copolymer or its hydride, methacrylic acid ester-acrylic acid ester copolymer, styrene-acrylic acid ester copolymer, acrylonitrile-acrylic acid ester copolymer, rubbers such as ethylene propylene rubber, polyvinyl alcohol, and polyvinyl acetate, cellulose derivatives such as ethyl cellulose, methyl cellulose, hydroxyethyl cellulose, and carboxymethyl cellulose, polyphenylene ether, polysulfone, polyethersulfone, polyphenylene sulfide, polyetherimide, polyimide, polyamide such as wholly aromatic polyamide (aramid), polyamideimide, polyacrylonitrile, polyvinyl alcohol, polyether, acrylic acid resin, and polyester. These materials may be used alone or in combination of two or more. The shape of the organic grains is not particularly limited, and any of spherical, fibrous, needle, scaly, plate and random shapes can be used.

This non-aqueous electrolyte battery can be manufactured, for example, according to the following examples.

[Separator Resin Layer Forming Process]

First, a resin layer is formed on one surface or both surfaces of the separator. The resin layer can be formed, for example, according to the following first and second examples.

The resin material constituting the resin layer and the grains are mixed at a predetermined mass ratio, and added to a dispersion solvent such as N-methyl-2-pyrrolidone, and the resin material is dissolved to obtain a resin solution. Subsequently, the resin solution is coated on or transferred to at least one surface of the separator. Examples of the coating method include a method of coating by a die coater and the like.

Subsequently, the separator on which the resin solution is coated is immersed in a water bath to cause the resin solution to be phase-separated to form a resin layer. The resin solution coated on the separator surface is contacted with water or the like which is a poor solvent for the resin material dissolved in the resin solution and is a good solvent for the dispersion solvent which dissolves the resin material, and finally is dried by hot air. With this, the separator 25 in which the resin layer which is made of a resin material of the three-dimensional network structure is formed and which carries grains on the separator surface can be obtained.

The resin material constituting the resin layer and the grains are mixed at a predetermined mass ratio, and added to a dispersion solvent such as 2-butanone (methyl ethyl ketone; MEK) or N-methyl-2-pyrrolidone (NMP), and are dissolved to obtain a resin solution. Subsequently, the resin solution is coated on at least one surface of the separator.

Subsequently, the separator on which the resin solution is coated is dried by a method of, for example, passing it through a drying furnace to volatilize the dispersion solvent, to thereby form a resin layer. At this time, it is preferable to set the temperature at the time of drying to be sufficiently high with respect to the dispersion solvent so that the dispersion solvent is vaporized to generate air bubbles in the resin solution.

The method of determining the minimum point according to the present technology is described below.

As an experimental battery for determining the local minimum value according to the present technology, it is not particularly limited as long as the same negative electrode and the same electrolytic solution and metallic lithium as the desired battery are used, but it is most preferable to use a small coin battery.

Figure 2:
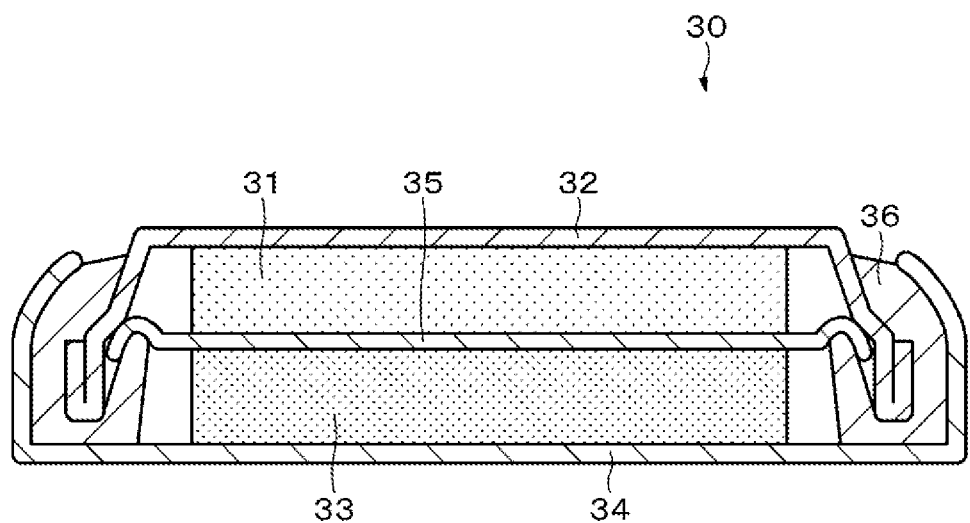
FIG. 2 is a cross-sectional view of a coin battery used as an experimental battery according to an embodiment of the present disclosure.

FIG. 2 illustrates an example of a coin battery used as an experimental battery. A coin battery 30 includes metal lithium 33, a negative electrode 31, an electrolytic solution, an insulating gasket 36, and a separator 35. A positive electrode can 34 is crimped and sealed to the negative electrode can 32 with the insulating gasket 36 interposed therebetween, so that a sealed chamber is formed between positive electrode can 34 and the negative electrode can 32.

A method of determining the minimum point at the charging rate 3 C is described.

The charging rate 3 C means that the predetermined capacity of the battery is fully charged in ⅓ hour (0.33 hours).

In the coin experimental battery including the negative electrode 31, the metal lithium 33, the electrolytic solution, and the separator 35, constant current and constant voltage charging is performed at 0 V at a charging rate of 0.1 C as a condition for initial charging to the negative electrode, and the charging is terminated at a time point at which the constant voltage charging current decreases to the charging rate of 0.01 C.

As a condition of lithium release, a released electricity amount obtained by releasing lithium at constant current at a 1.5 V termination at a charging rate of 0.1 C is denoted by A.

Next, this battery is charged to the final electricity amount A at a charging rate of 3 C. At this time, the SOC when the charged electricity amount is B is defined as follows.

$$SOC = B \div A \times 100$$

Figure 3:
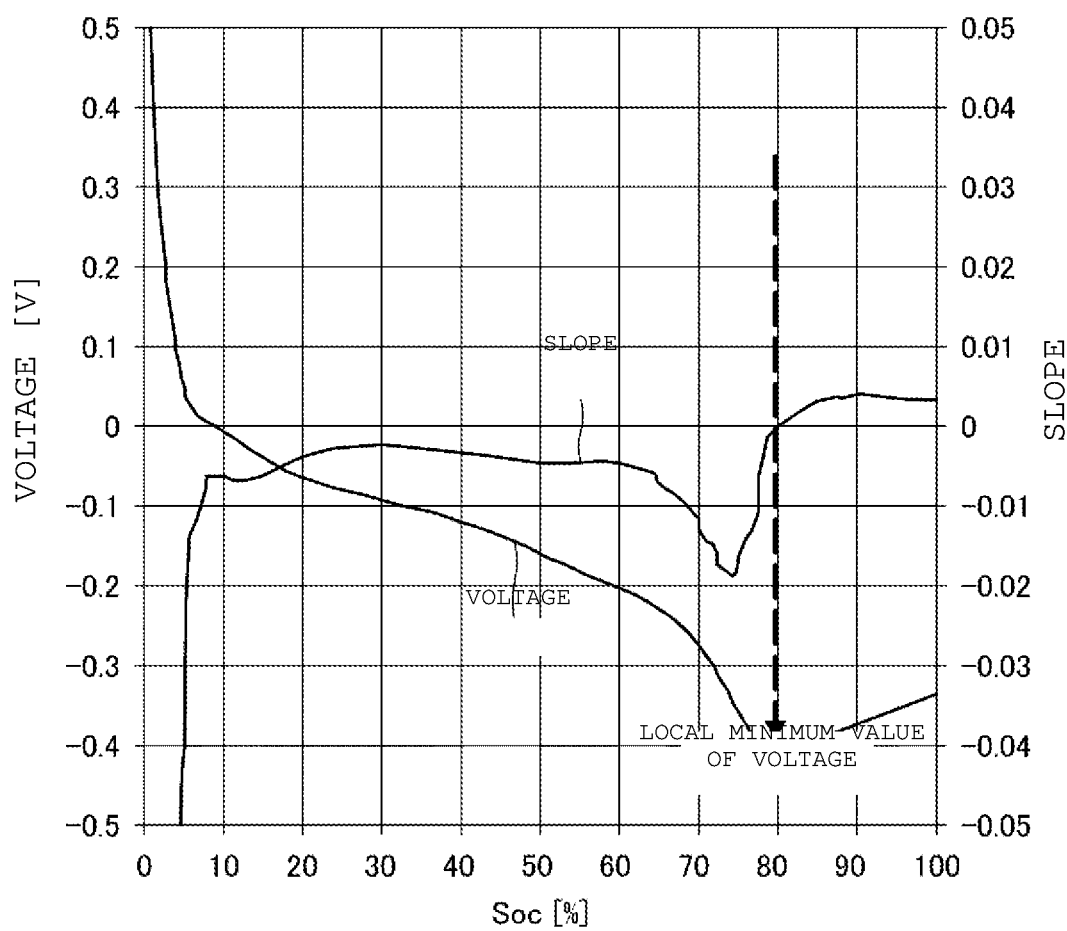
FIG. 3 is a graph for explaining a charging method of the present technology according to an embodiment of the present disclosure.

With respect to SOC (%) which is a ratio of the inserted electricity amount A, the voltage and the slope of the voltage are shown in FIG. 3.

The slope of the voltage is zero at SOC=80%. That is, the voltage takes a local minimum value at SOC=80%.

Figure 4:
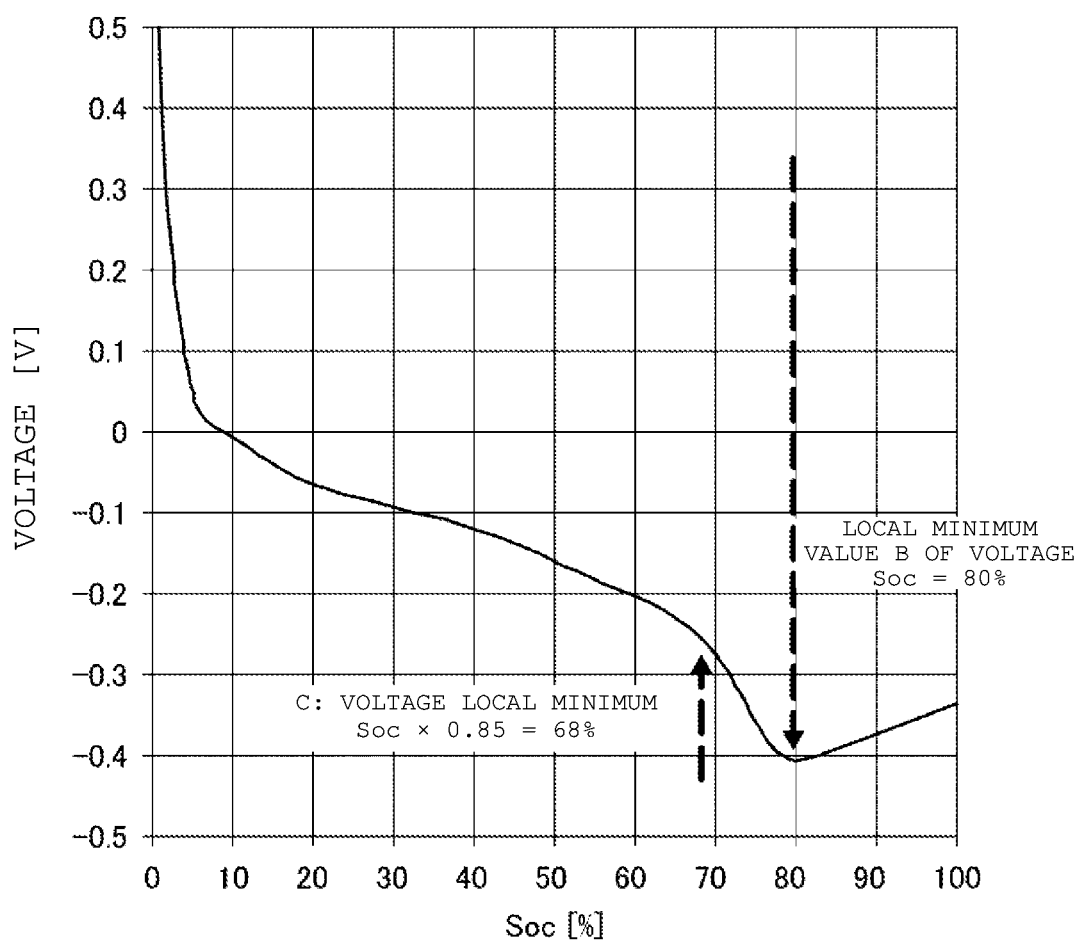
FIG. 4 is a graph for explaining a charging method according to an embodiment of the present disclosure.

FIG. 4 shows a method of determining the current switching SOC.

A SOC value of 70 to 90% of the SOC giving a local minimum value is defined as C.

In FIG. 4, 85% of the local minimum SOC=80%: 80×0.85=68% is defined as the switching SOC=C at a charging rate of 3 C.

In the example of FIG. 4, when lithium is inserted at the charging rate 3 C with respect to this negative electrode, it is recognized that lithium deposition occurs in a region where the overvoltage after SOC=80% decreases. Furthermore, up to SOC=68%, which is in front of 15% of the local minimal SOC, including the safety margin, is determined to be a possible range of the charging rate of 3 C.

Further, the voltage local minimum value is obtained by similar experiment for each of a plurality of desired charging rates, and the SOC of 70 to 90% of the local minimum SOC is defined as the switching SOC at each current.

Figure 5:
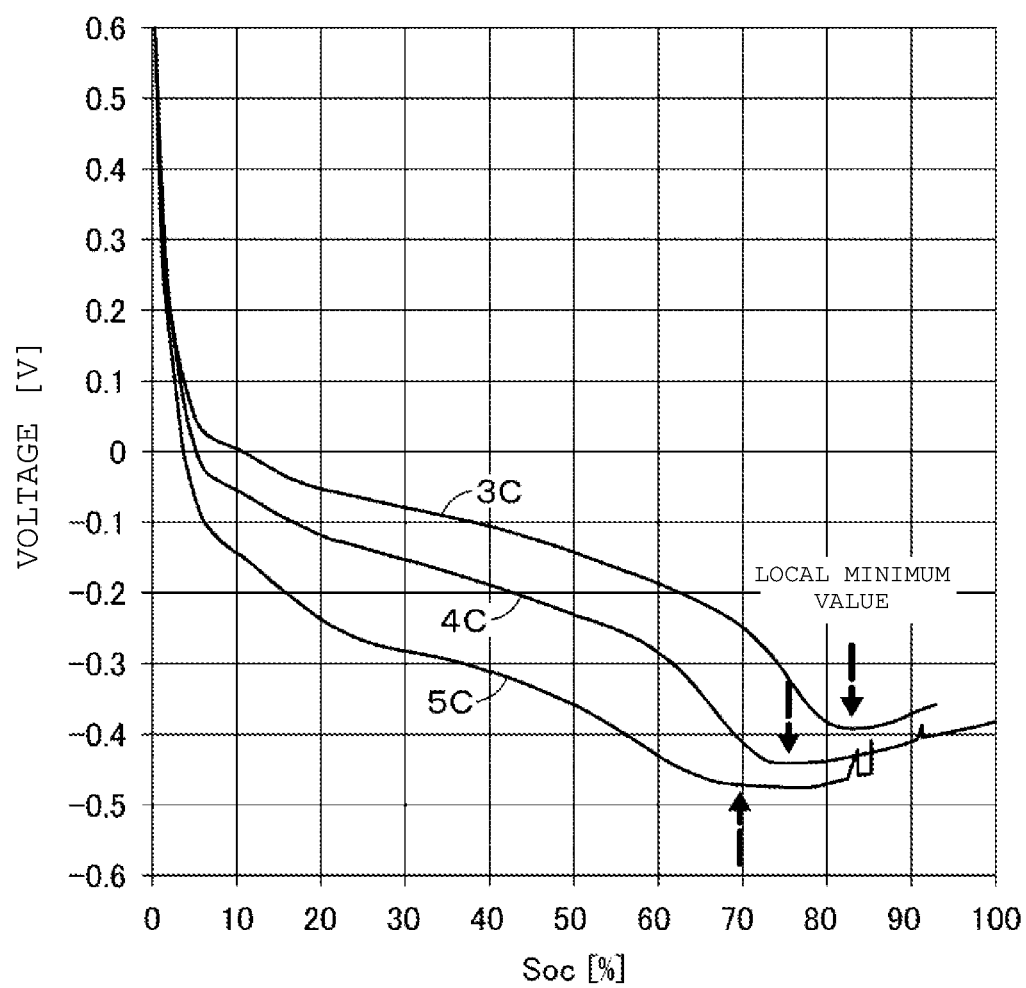
FIG. 5 is a graph for explaining a charging method according to an embodiment of the present disclosure.

In FIG. 5, the local minimum SOCs were 83%, 75%, and 70% by constant current charging at charging rates 3 C, 4 C, and 5 C, respectively. Further, as shown in FIG. 6, 70 to 90% of these values, in this case, 85%, were taken, and 71%, 64%, and 60% were obtained as switching SOCs.

The SOC giving the local minimum value is 83% at the charging rate of 3 C, and exceeds 80%, so that there is no need to switch to lower current, and constant current and constant voltage charging is terminated at a charging rate 3 C. That is, the charging may be performed up to SOC=100%.

From the above, with respect to this negative electrode, there are performed, for example, constant current charging at a charging rate of 5 C at SOC=0 to 60%, constant current charging at a charging rate of 4 C at SOC=60 to 64%, and constant current and constant voltage charging at a charging rate of 3 C at SOC=64% to 100%.

By charging according to the above, high-speed charging can be performed while avoiding lithium deposition on the negative electrode.

It is considered that the local minimum value of the voltage related to the present technology has a relation to lithium deposition. Deposition of lithium rather than insertion of lithium between graphite layers generates such a local minimum value of the voltage because the reaction proceeds with small energy, that is, small overvoltage.

In order to obtain the current switching SOC from the minimum SOC value B of the voltage according to the present technology, the charged electricity amount B may be multiplied by a value of 0.7 or more and 0.9 or less as a margin ratio. Although lithium is significantly deposited after the local minimum SOC but in order to avoid the occurrence of very small deposition before the local minimum SOC, the SOC slightly ahead is defined as switching SOC=C.

The switching SOC=C is preferably 0.9 times or less of the minimum SOC and more preferably 0.6 times or more and 0.9 times or less of the minimum SOC. If it is more than 0.9 times, a small amount of lithium deposition locally occurs due to non-uniformity in the battery and the like, and there is an adverse effect that the life is reduced. If it is 0.6 times or less, early switching to low charging current is required, so that life is further improved, but charging time becomes a little longer.

Although the SOC value at which the local minimum value of the voltage according to the present technology appears is affected by the charging current, it is also affected by the environmental temperature. That is, even when the same charging current is supplied to the same negative electrode, when the environmental temperature decreases, a local minimum value is generated at an early stage of charging (low SOC). Therefore, it is preferable to set the switching SOC value of the charging rate according to the environmental temperature at the start of charging.

In addition, there is no particular limitation on the circuit and the device which perform the constant current charging and the constant voltage charging according to the present technology, and a constant current and constant voltage charging device generally used widely can be used as it is. Furthermore, there is no particular limitation on the method of measuring the temperature of the outside of the battery, the charged electricity amount, and the charging voltage, and the measuring device according to the present technology, and a device and a measuring method generally used widely can be used as it is.

Figure 7:
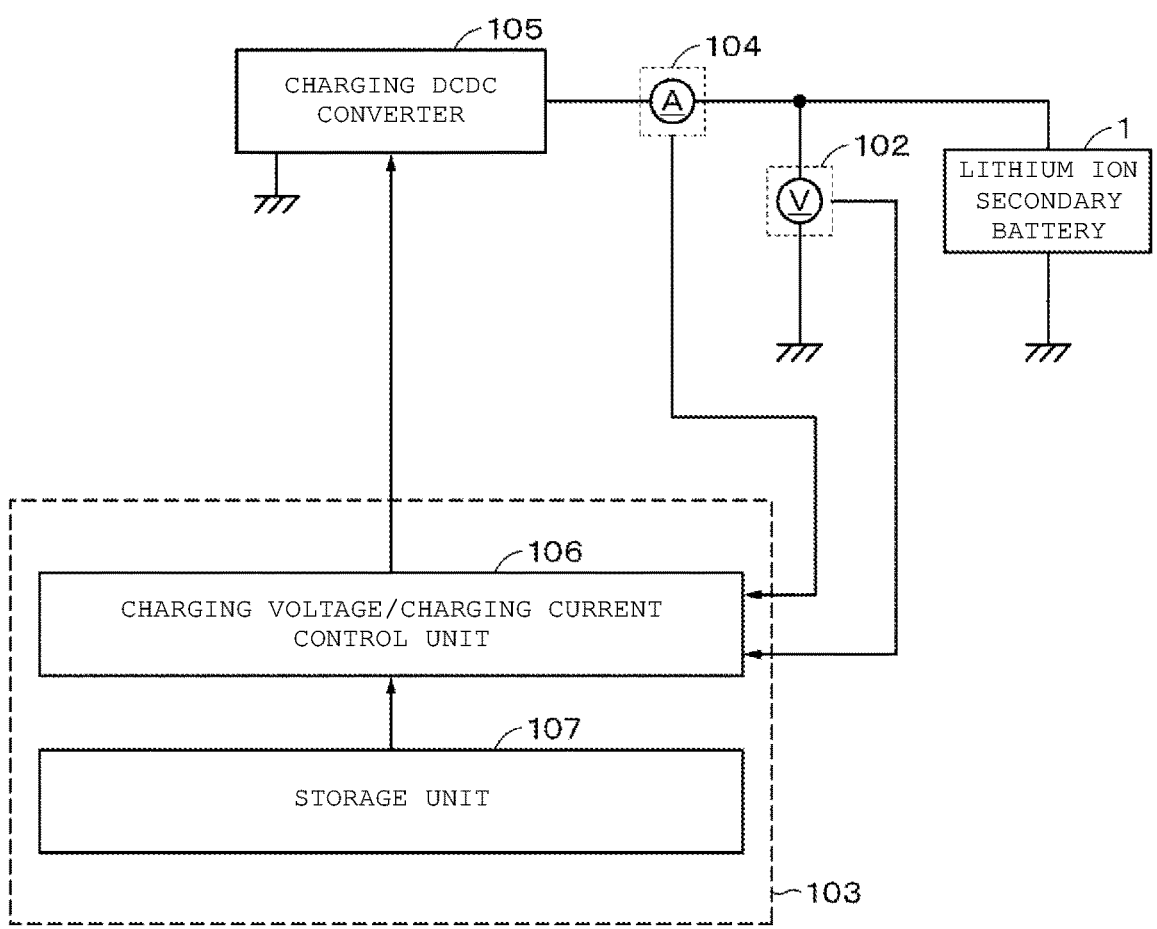
FIG. 7 is a block diagram for explaining an example of a charging device for performing a charging method according to an embodiment of the present disclosure.

For example, a charging device 101 that performs the charging method according to the present technology described above is described with reference to FIG. 7. In FIG. 7, the reference symbol 1 denotes a battery to be controlled, for example, a lithium ion secondary battery. The lithium ion secondary battery 1 includes a plurality of battery blocks provided in an electronic device, for example, a UPS, as described later.

The voltage of the lithium ion secondary battery 1 is detected by a voltage detection unit 102, and the detected battery voltage is supplied to a control unit 103. The current of the lithium ion secondary battery 1 is detected by a current detection unit 104, and a detection signal of the current detection unit 104 is supplied to the control unit 3. Furthermore, a charging DCDC converter 105 is provided, and the converted voltage or current is supplied to the lithium ion secondary battery 1.

The control unit 103 is configured of a central processing unit (CPU), a random access memory (RAM), a read only memory (ROM), and the like. The whole operation of the battery device is controlled in accordance with a program stored in advance in a storage unit (ROM) 107 of the control unit 103. The charging DCDC converter 105 is controlled by a charging voltage/charging current control unit 106 of the control unit 103, and at constant current charging, the C rate (1 C to 5 C) to be switched is controlled according to the value of SOC is controlled.

Figure 6:
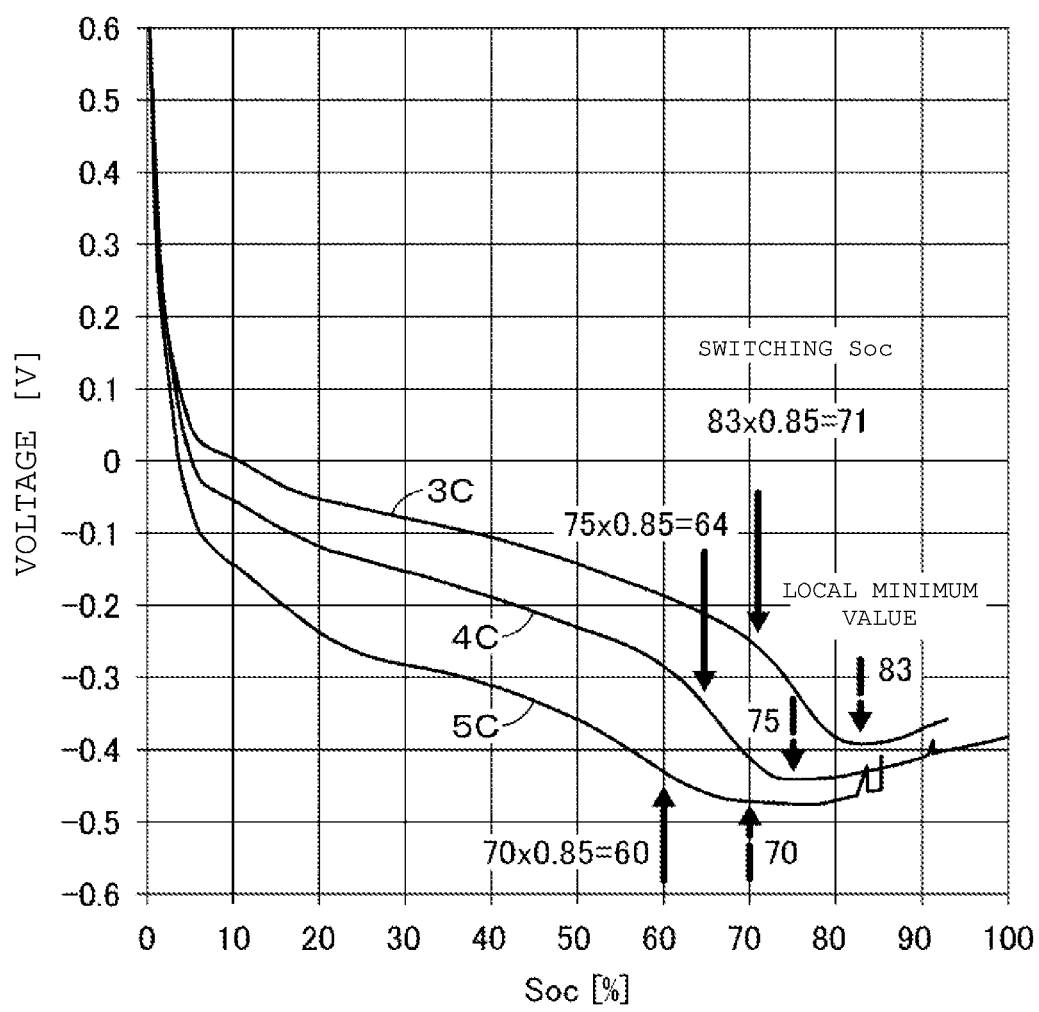
FIG. 6 is a graph for explaining a charging method according to an embodiment of the present disclosure.

Furthermore, in the present technology, for example, as shown in FIG. 6, the present technology can be applied to a pulse charging method in which the charging current is interrupted.

EXAMPLES

Hereinafter, an embodiment of the present technology is described in detail by way of examples. Note that the present technology is not limited to the configurations of the following examples.

97% by mass of $LiNi_{0.86}Co_{0.1}Al_{0.04}O_2$ which was a positive electrode active material, 1% by mass of carbon black which was a conductive agent, and 2% by mass of polyvinylidene fluoride (PVdF) which was a binder were mixed to prepare a positive electrode mixture, and this positive electrode mixture was dispersed in N-methyl-2-pyrrolidone (NMP) as a dispersion medium to obtain a positive electrode mixture slurry. The positive electrode mixture slurry was coated on both surfaces of a positive electrode current collector made of strip-like aluminum foil having a thickness of 12 μm, so that a part of the positive electrode current collector was exposed. Thereafter, the dispersion medium of the coated positive electrode mixture slurry was evaporated and dried, and compression molding was performed using a roll press to form a positive electrode active material layer. Finally, a positive electrode terminal was attached to the positive electrode current collector exposed portion to form a positive electrode.

95% by mass of granular graphite grain having an average grain diameter of 20 μm which was a negative electrode active material, 1.5% by mass of acrylic acid-modified styrene-butadiene copolymer as a binder, 2% by mass of fine grain polyvinylidene fluoride (PVdF) having a grain diameter of 0.3 μm, and 1.5% by mass of carboxymethyl cellulose as a thickener were mixed to obtain a negative electrode mixture, and a proper amount of water was further added and stirred to prepare a negative electrode mixture slurry. The negative electrode mixture slurry was coated on both surfaces of a negative electrode current collector made of strip-like copper foil having a thickness of 15 μm, so that a part of the negative electrode current collector was exposed. Thereafter, the dispersion medium of the coated negative electrode mixture slurry was evaporated and dried, and compression molding was performed using a roll press to form a negative electrode active material layer. Finally, a negative electrode terminal was attached to the negative electrode current collector exposed portion to form a negative electrode.

Lithium hexafluorophosphate ($LiPF_6$) as electrolyte salt was dissolved into a non-aqueous solvent in which carbonate ethylene (EC), carbonate methyl ethyl (MEC), and carbonate vinylene (VC) were mixed at a mass ratio of 30:69:0.5 at a concentration of 1 mol/dm³ to prepare a non-aqueous electrolytic solution.

After a PVdF N-methylpyrrolidone solution is coated on a separator containing polyethylene and polypropylene having a thickness of 12 μm, a PVdF solution was phase-separated by immersion in a water bath, and was dried by warm air.

Next, a rectangular positive electrode, a rectangular negative electrode, and a separator were laminated in the order of the positive electrode, the separator, the negative electrode (with PVdF layers formed on both surfaces), and the separator to form a laminated electrode body.

Next, the laminated electrode body was covered with a laminate film having a soft aluminum layer, and the derived sides of the positive electrode terminal and the negative electrode terminal around the laminated electrode body and the other three sides were encapsulated by thermal fusion and sealed. Next, the cell shape was shaped by pressing.

With this, a laminate film type battery having a battery shape of 37 mm in thickness, 49 mm in width, 84 mm in height (374984 size), and a battery capacity of 2300 mAh was produced.

A charging/discharging test was performed on the following examples and comparative examples to evaluate them. The test results are shown in Table 2.

A coin battery for measuring the local minimum value illustrated in FIG. 2 was produced using the above-mentioned negative electrode, but using the negative electrode provided with the mixture layer only on one surface, lithium metal having a thickness of 1 mm, and the electrolytic solution.

Next, constant current and constant voltage charging was performed at 0 V at a charging rate of 0.1 C (0.6 mA) at an ambient temperature of 23° C., and the charging is terminated at a time point at which the constant voltage charging current decreases to a charging rate of 0.01 C (0.06 mA) of the initial insertion current.

As a condition of lithium release, lithium was released at a constant current at a charging rate of 0.1 C (0.6 mA) and 1.5 V termination.

The obtained released electricity amount A was 6.0 (mAh).

Next, lithium is inserted up to 6 (mAh) at the charging current shown in Table 1 in this coin battery for local minimum value experiment. At this time, the SOC when the charged electricity amount is B is defined as follows.

$$SOC = B\ (mAh) \div 6\ (mAh) \times 100$$

TABLE 1

| Ambient Temperature | Charging Current | Minimum Soc | Margin Ratio | Current Switching Soc |
|---|---|---|---|---|
| 23° C. | 2 C (12 mA) | 85% | 0.9 times | 76% |
| 23° C. | 3 C (18 mA) | 83% | 0.9 times | 74% |
| 23° C. | 4 C (24 mA) | 75% | 0.9 times | 67% |
| 23° C. | 5 C (30 mA) | 70% | 0.9 times | 63% |

Figure 8:
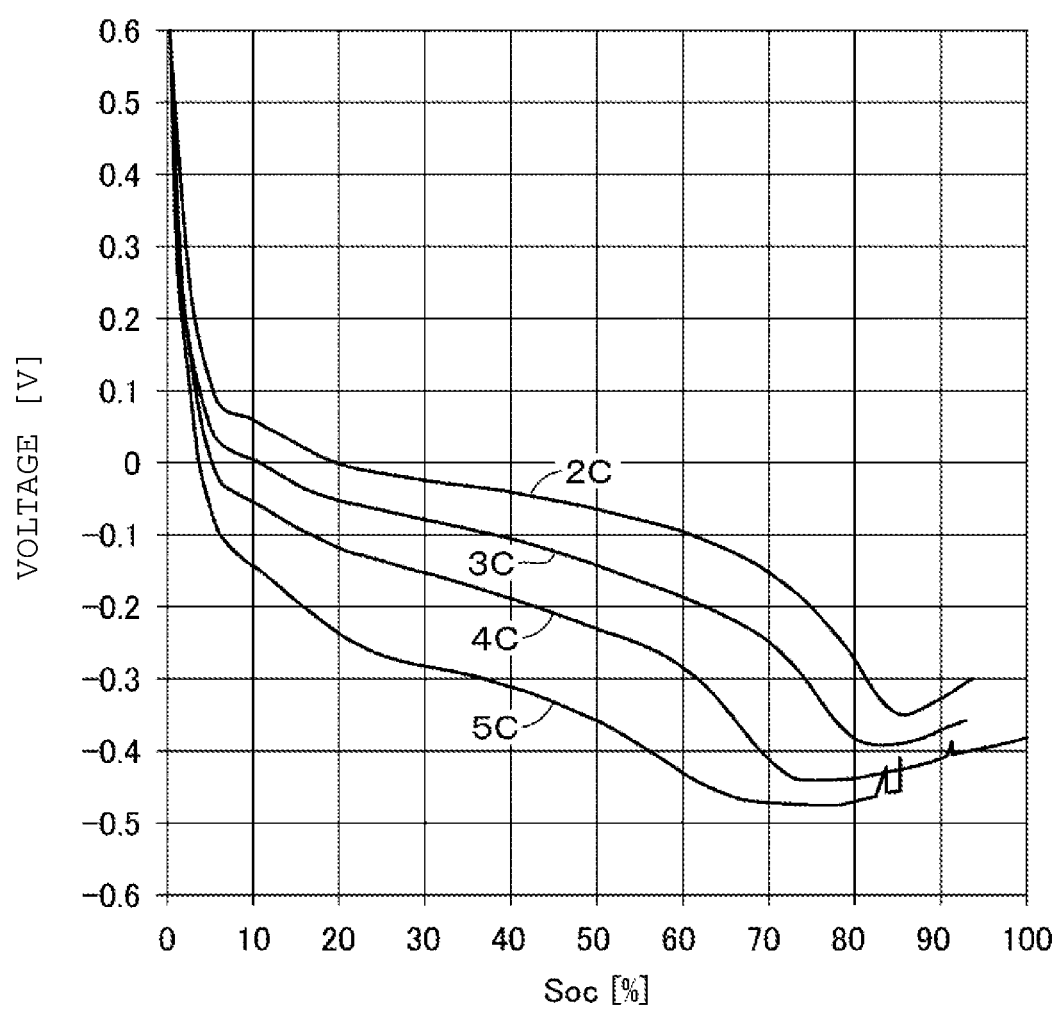
FIG. 8 is a graph for explaining a charging method according to an embodiment of the present disclosure.

FIG. 8 shows the voltage with respect to the ratio SOC (%) with respect to the inserted electricity amount A.

Similarly, the results of measuring the minimum SOC at an ambient temperature of 15° C. and 10° C. are shown in Table 2.

Table 1 shows the charging current, the obtained minimum SOC, the set margin ratio, and the calculated current switching SOC.

Table 2 shows the charging current and the obtained minimum SOC.

TABLE 2

| Ambient Temperature | Charging Current | Minimum Soc |
|---|---|---|
| 15° C. | 1 C | 0.8 |
| 15° C. | 2 C | 0.75 |
| 15° C. | 3 C | 0.7 |
| 10° C. | 1 C | 0.71 |
| 10° C. | 2 C | 0.66 |
| 10° C. | 3 C | 0.61 |

The slope of the voltage is zero at SOC=80%. That is, the voltage takes a local minimum value at SOC=80%. FIG. 4 shows a method of determining the current switching SOC.

A SOC value of 70 to 90% of the SOC giving a local minimum value is defined as C.

In FIG. 4, 85% of the local minimum SOC (80%): 80×0.85=68% is defined as the switching SOC=C at the 3 C charging.

The above-mentioned laminate film type battery was subjected to constant current and constant voltage charging at 230 mA and −4.2 V under the condition shown in Table 1 obtained with the coin battery for local minimum value experiment in a constant temperature bath set to an environmental temperature of 23° C., and the charging was terminated when the charging current decreased to 100 mA.

After rest for 30 minutes, constant current discharging was performed at 230 mA, the discharging was terminated at a battery voltage of 3 V, and initial capacity was determined. The ratio of the charging amount to the initial capacity was defined as SOC.

Next, after rest for 30 minutes, charging was performed under the condition shown in Table 1.

Next, constant current charging was performed under the condition shown in Table 3, and after rest for 30 minutes, constant current discharging was performed at 11500 mA, and the discharging was terminated at a battery voltage of 3 V.

The charging and discharging were repeated 800 times under the above conditions.

TABLE 3

| Example Comparative Example | Ambient Temperature [° C.] | Soc Range [%] | Margin Ratio | Charging C Rate | Charging Current [mA] |
|---|---|---|---|---|---|
| Example 1 | 23 | 0-63 | 0.9 | 5 | 11500 |
|  |  | 63-67 | 0.9 | 4 | 9200 |
|  |  | 67-74 | 0.9 | 3 | 6900 |
|  |  | 74-76 | 0.9 | 2 | 4600 |
| Example 2 | 23 | 0-63 | 0.9 | 5 | 11500 |
|  |  | 63-67 | 0.9 | 4 | 9200 |
|  |  | 67-74 | 0.9 | 3 | 6900 |
|  |  | 74-Full Charge | 0.9 | 2 | 4600 |
| Example 3 | 23 | 0-56 | 0.8 | 5 | 11500 |
|  |  | 56-60 | 0.8 | 4 | 9200 |
|  |  | 60-66 | 0.8 | 3 | 6900 |
|  |  | 66-Full Charge | 0.8 | 2 | 4600 |
| Example 4 | 23 | 0-53 | 0.75 | 5 | 11500 |
|  |  | 53-56 | 0.75 | 4 | 9200 |
|  |  | 56-62 | 0.75 | 3 | 6900 |
|  |  | 64-Full Charge | 0.75 | 2 | 4600 |
| Example 5 | 23 | 0-42 | 0.6 | 5 | 11500 |
|  |  | 42-45 | 0.6 | 4 | 9200 |
|  |  | 45-50 | 0.6 | 3 | 6900 |
|  |  | 50-Full Charge | 0.6 | 2 | 4600 |
| Example 6 | 15 | 0-56 | 0.8 | 3 | 6900 |
|  |  | 56-60 | 0.8 | 2 | 4600 |
|  |  | 60-Full Charge | 0.8 | 1 | 2300 |
| Example 7 | 10 | 0-49 | 0.8 | 3 | 6900 |
|  |  | 49-53 | 0.8 | 2 | 4600 |
|  |  | 53-Full Charge | 0.8 | 1 | 2300 |
| Comparative Example 1 | 23 | 0-Full Charge | — | 2 | 4600 |
| Comparative Example 2 | 23 | 0-Full Charge | — | 5 | 11500 |
| Comparative Example 3 | 23 | 0-69 | 1.1 | 5 | 11500 |
|  |  | 69-74 | 1.1 | 4 | 9200 |
|  |  | 74-82 | 1.1 | 3 | 6900 |
|  |  | 82-Full Charge | 1.1 | 2 | 4600 |
| Comparative Example 4 | 23 | 0-Full Charge | — | 2 | 4600 |
| Comparative Example 5 | 23 | 0-Full Charge | — | 2 | 4600 |

| Example Comparative Example | Charging Method | Charging Time [min] | Total Charging Time [min] | Capacity Retention Rate After 800 Cycles [%] |
|---|---|---|---|---|
| Example 1 | Constant Current Charging | 7.6 | 10 | 96 |
|  | Constant Current Charging | 0.6 |  |  |
|  | Constant Current Charging | 1.4 |  |  |
|  | Constant Current Charging | 0.6 |  |  |
| Example 2 | Constant Current Charging | 7.6 | 22 | 95 |
|  | Constant Current Charging | 0.6 |  |  |
|  | Constant Current Charging | 1.4 |  |  |
|  | Constant Current and Constant Voltage Charging | 12.0 |  |  |
| Example 3 | Constant Current Charging | 6.7 | 27 | 97 |
|  | Constant Current Charging | 0.6 |  |  |
|  | Constant Current Charging | 1.2 |  |  |
|  | Constant Current and Constant Voltage Charging | 18.0 |  |  |

TABLE 3-continued

| | | | | |
|---|---|---|---|---|
| Example 4 | Constant Current Charging | 6.4 | 28 | 98 |
| | Constant Current Charging | 0.5 | | |
| | Constant Current Charging | 1.2 | | |
| | Constant Current and Constant Voltage Charging | 20.0 | | |
| Example 5 | Constant Current Charging | 5.0 | 29 | 98 |
| | Constant Current Charging | 0.5 | | |
| | Constant Current Charging | 1.0 | | |
| | Constant Current and Constant Voltage Charging | 23.0 | | |
| Example 6 | Constant Current Charging | 11.2 | 36 | 95 |
| | Constant Current Charging | 1.2 | | |
| | Constant Current and Constant Voltage Charging | 24.0 | | |
| Example 7 | Constant Current Charging | 9.8 | 39 | 92 |
| | Constant Current Charging | 1.2 | | |
| | Constant Current and Constant Voltage Charging | 28.2 | | |
| Comparative Example 1 | Constant Current and Constant Voltage Charging | — | 42 | 98 |
| Comparative Example 2 | Constant Current and Constant Voltage Charging | — | 18 | 29 |
| Comparative Example 3 | Constant Current Charging | 8.3 | 23 | 34 |
| | Constant Current Charging | 0.8 | | |
| | Constant Current Charging | 1.6 | | |
| | Constant Current and Constant Voltage Charging | 12.0 | | |
| Comparative Example 4 | Constant Current and Constant Voltage Charging | — | 45 | 36 |
| Comparative Example 5 | Constant Current and Constant Voltage Charging | — | 50 | 31 |

At the 801st charging and discharging, constant current and constant voltage charging was performed at an ambient temperature of 23° C. at 230 mA and −4.2 V, and charging was terminated when the charging current decreased to 100 mA. After rest for 30 minutes, constant current discharging was performed at a discharging current of 230 mA, and the discharging was terminated at a battery voltage of 3 V. The obtained capacity was divided by the initial capacity to obtain a capacity retention rate after the cycle.

In [Example 2]-[Example 7], a cycle test was performed with the charging condition described in Table 3 in a similar evaluation procedure as [Example 1] under the charging condition shown in Table 3, and the result of the capacity retention rate after 800 cycles was obtained.

In [Comparative Example 1]-[Comparative Example 5], with respect to the above-mentioned cell, the initial capacity was determined in a similar manner as in Example 1 at an environmental temperature of 23° C., and then a cycle test was performed under the charging condition shown in Table 3.

After repetition of charging and discharging 800 times, the capacity retention ratio after the cycle test was determined in a similar manner as in Example 1.

The charging/discharging cycle test of the laminate film type battery was performed under the conditions of Table 1 and Table 2 obtained by the coin battery for local minimum value experiment, and the following facts can be seen from Table 3. It can be seen that the charging method according to the present technology maintains a high capacity retention rate even after 800 cycles of charging and discharging while maintaining a short charging time. On the other hand, in the charging method of Comparative Examples 1-5, although the charging time is short, a large capacity decrease is observed. Meanwhile, it can be seen that although the capacity deterioration is small, the charging time is long. Further, it can be seen that the capacity deterioration becomes large particularly when the margin ratio exceeds 0.9. From these results, it is possible to extend the life of the battery while keeping the charging time short.

Although the embodiment of the present technology has been described above in detail, the present technology is not limited to each embodiment described above, and various modifications may be made based on the technical idea of the present technology.

Furthermore, the configurations, methods, processes, shapes, materials, numerical values, and the like of the embodiment described above can be combined with one another without departing from the spirit of the present technology.

For example, the numerical values, configurations, shapes, materials, raw materials, manufacturing processes, and the like described in the embodiment and the examples described above are merely examples, and different numerical values, structures, shapes, materials, raw materials, manufacturing processes, and the like may be used as necessary.

In addition, the configurations, methods, processes, shapes, materials, numerical values, and the like of the embodiment and examples described above can be combined with one other without departing from the spirit of the present technology.

For example, in the embodiment and the examples, the case where the battery structure is a laminate film type and the case where the electrode body has a laminated structure are described as examples, but the present technology is not limited thereto. The electrolyte layer of the present technology is similarly applicable to the case of having another battery structure such as a cylindrical, coin, square, or button type.

Instead of the above-mentioned electrolyte layer, other electrolyte layers composed of the following electrolytes may be used. As a first example of the other electrolyte layers, there may be used, for example, a solid electrolyte layer which includes endothermic grains, an ion conductive polymer material, and electrolyte salt, and is composed of a solid electrolyte having ion conductivity by the ion conductive polymer material and the electrolyte salt.

Examples of the ion conductive polymer material include polyether, polyester, polyphosphazene, and polysiloxane.

As a second example of the other electrolyte layers, there may be used, for example, a solid electrolyte layer which includes endothermic grains and an ion conductive polymer material, and is composed of a solid electrolyte having ion conductivity by the polymer material.

As a third example of the other electrolyte layers, there may be used a solid electrolyte layer which includes endothermic grains and an ion conductive inorganic material, and is composed of a solid electrolyte having ion conductivity by the inorganic material.

Examples of the ion conductive inorganic material include ion conductive ceramic, ion conductive crystal, and ion conductive glass.

The degree of deterioration of the battery may be periodically measured or estimated, and the margin rate may be reduced according to the degree of deterioration for charging. Such control can shorten the charging time as much as possible and realize a high capacity maintenance rate.

The degree of deterioration can be determined by various methods such as comparison of internal resistance and full charging capacity, for example.

Next, Application Example 1 of the present technology is described.

Figure 9:
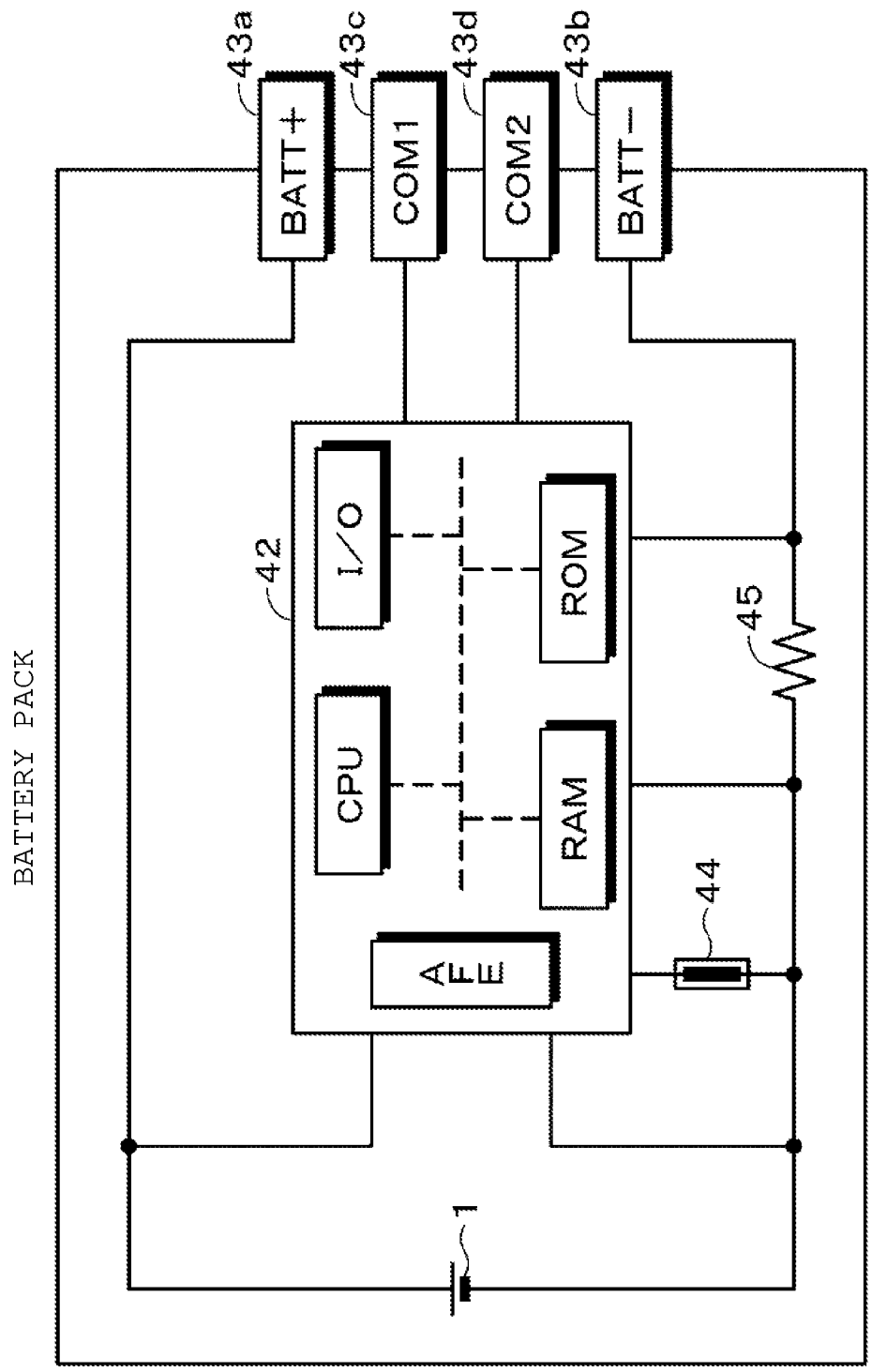
FIG. 9 is a block diagram illustrating an application example according to an embodiment of the present disclosure.

FIG. 9 is a block diagram illustrating an example of a circuit configuration when the non-aqueous electrolyte battery of the present technology is applied to a battery pack. In the battery pack, the battery cell 1 of the secondary battery and the elements related to the control unit (controller) 42 are accommodated in the same housing (case). The specified charging voltage of the battery cell 1 is set to, for example, 4.35 V.

The battery pack includes connectors 43a, 43b, 43c, and 43d for connection to the outside. The connector 43a is connected to the positive electrode of the battery cell 1, and the connector 43b is connected to the negative electrode of the battery cell 1. The connectors 43c and 43d are terminals for communication between the control unit 42 and the outside.

The control unit 42 that controls the battery pack is a microcomputer that is configured of, for example, a central processing unit (CPU) or processor, a random access memory (RAM), a read only memory (ROM), an input/output (I/O), and an analog front end (AFE). AFE is an analog circuit arranged between an analog signal unit and the CPU of the control unit 42. A switching element for turning on/off the charging current and a switching element for turning on/off the discharging current may be provided in the battery pack, and these switching elements may be controlled by the control unit 42.

The control unit 42 is supplied with the voltage of the battery cell 1. Furthermore, the temperature in the battery pack is measured by a temperature detection element such as a thermistor 44, and the measured temperature information is supplied to the control unit 42. Further, the current flowing through a current path of the battery cell 1 is detected by a current detection resistor 45, and the detected current value is supplied to the control unit 42.

The control unit 42 controls the charging operation for the battery cell 1. The control performed by the control unit 42 is performed according to a program stored in advance in the ROM. At the time of charging, the positive and negative output terminals of the charging device and the connectors 43a and 43b of the battery pack are connected, and the communication terminal of the charging device and the connectors 43c and 43d are connected. The charging device generates a charging voltage and a charging current of predetermined values from a commercial power source as an example, and the charging voltage and the charging current are set by communication with the control unit 42 of the battery pack. For example, serial communication is used as a communication method.

The control unit 42 performs constant current and constant voltage charging at 230 mA and −4.2 V. When the charging current in a constant voltage charging unit decreases to 100 mA, the control unit 42 stops charging. The control unit 42 stores SOC, which is a ratio of the charging amount to the initial capacity of the battery pack, a range of the SOC, a margin ratio, and the like. For example, it is known that the capacity deterioration of the battery cell is increased when the margin ratio exceeds 90%, and therefore, the control unit 42 performs control so that the margin ratio does not exceed this ratio. A command to control the charging current, the range of the SOC, and the margin ratio is transmitted to the charging device. By such control, as described above, the average charging time does not become too long, and the value of the capacity retention rate after the cycle can be made good.

Figure 10:
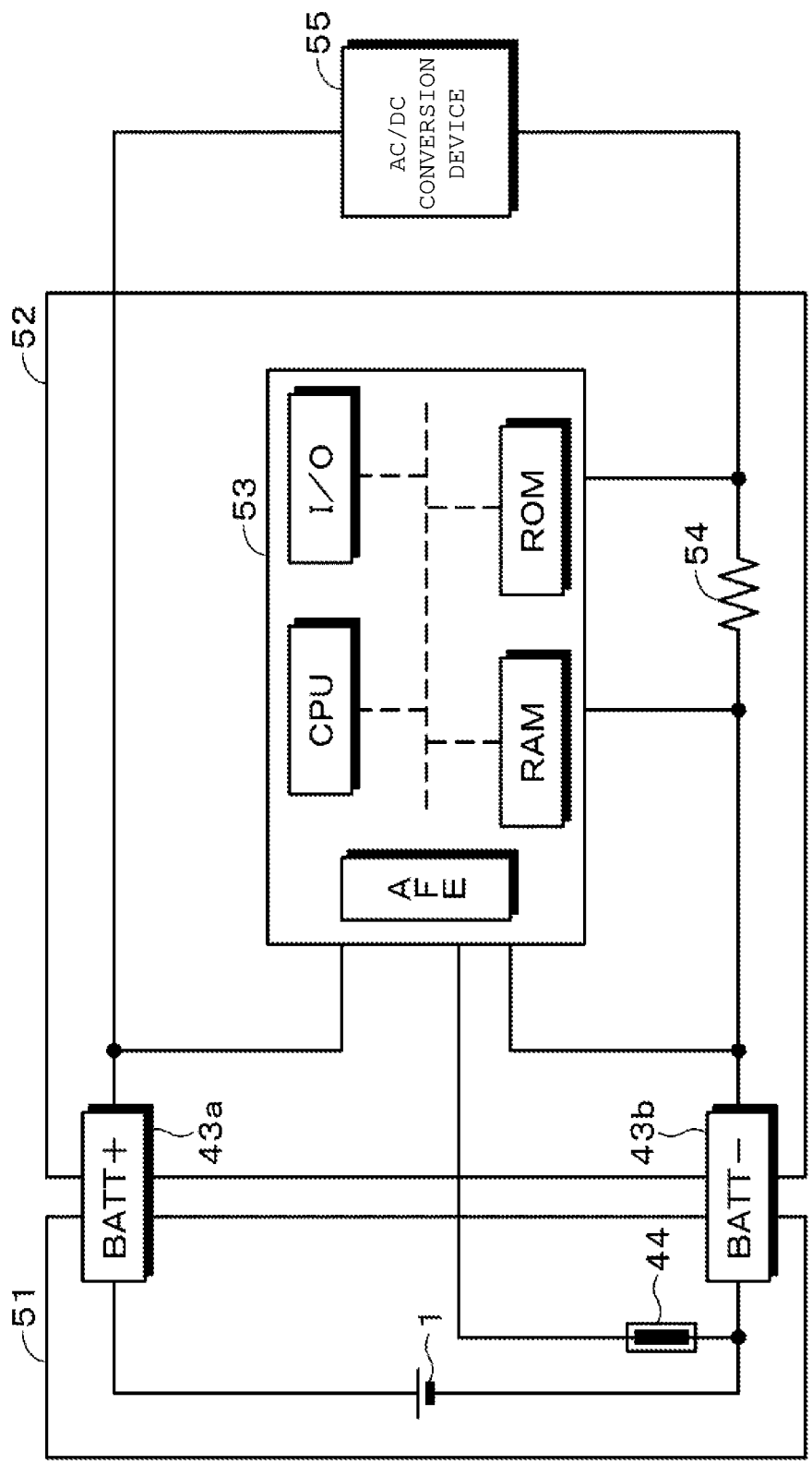
FIG. 10 is a block diagram illustrating an application example according to an embodiment of the present disclosure.

As illustrated in FIG. 10, the charging may be controlled on the side of the electronic device. A battery pack 51 includes the battery cell 1 and a thermistor 44. An electronic device 52 includes a control unit 53 and a current detection resistor 54. A DC power source formed by an AC/DC conversion device 55 is used as a charging power source. The control unit 53 of the electronic device 52 performs control similar to that of the control unit 42 described above. Similar effects can be obtained also by this configuration.

Figure 11:
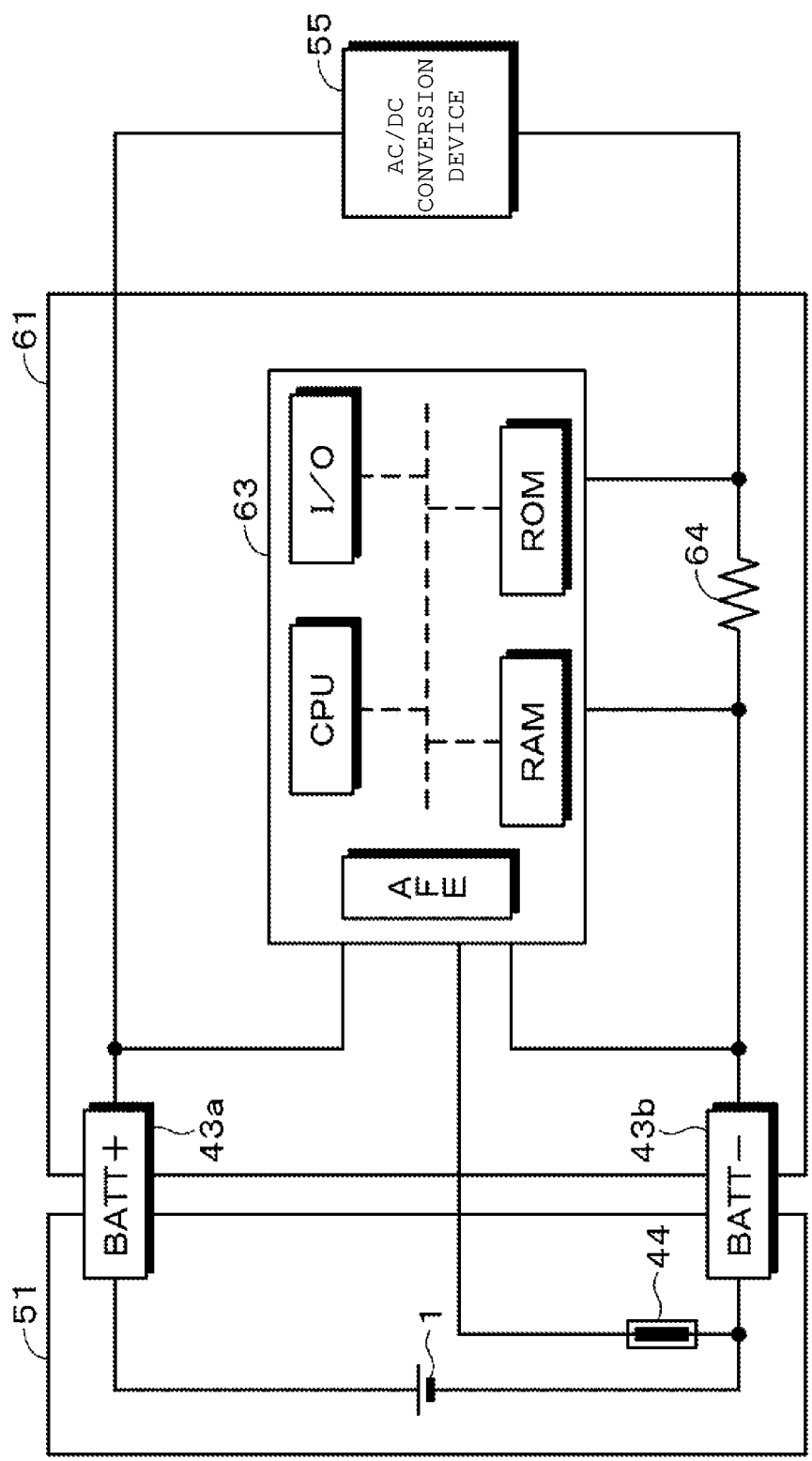
FIG. 11 is a block diagram illustrating an application example according to an embodiment of the present disclosure.

As illustrated in FIG. 11, a configuration is also possible in which control is performed on the side of a charging device 61 that charges the battery pack 51. The charging device 61 includes a control unit 63 and a current detection resistor 64. The control unit 63 of the charging device 61 performs control similar to that of the control unit 42 of the above-described embodiment. Similar effects can be obtained also by this configuration.

Figure 12:
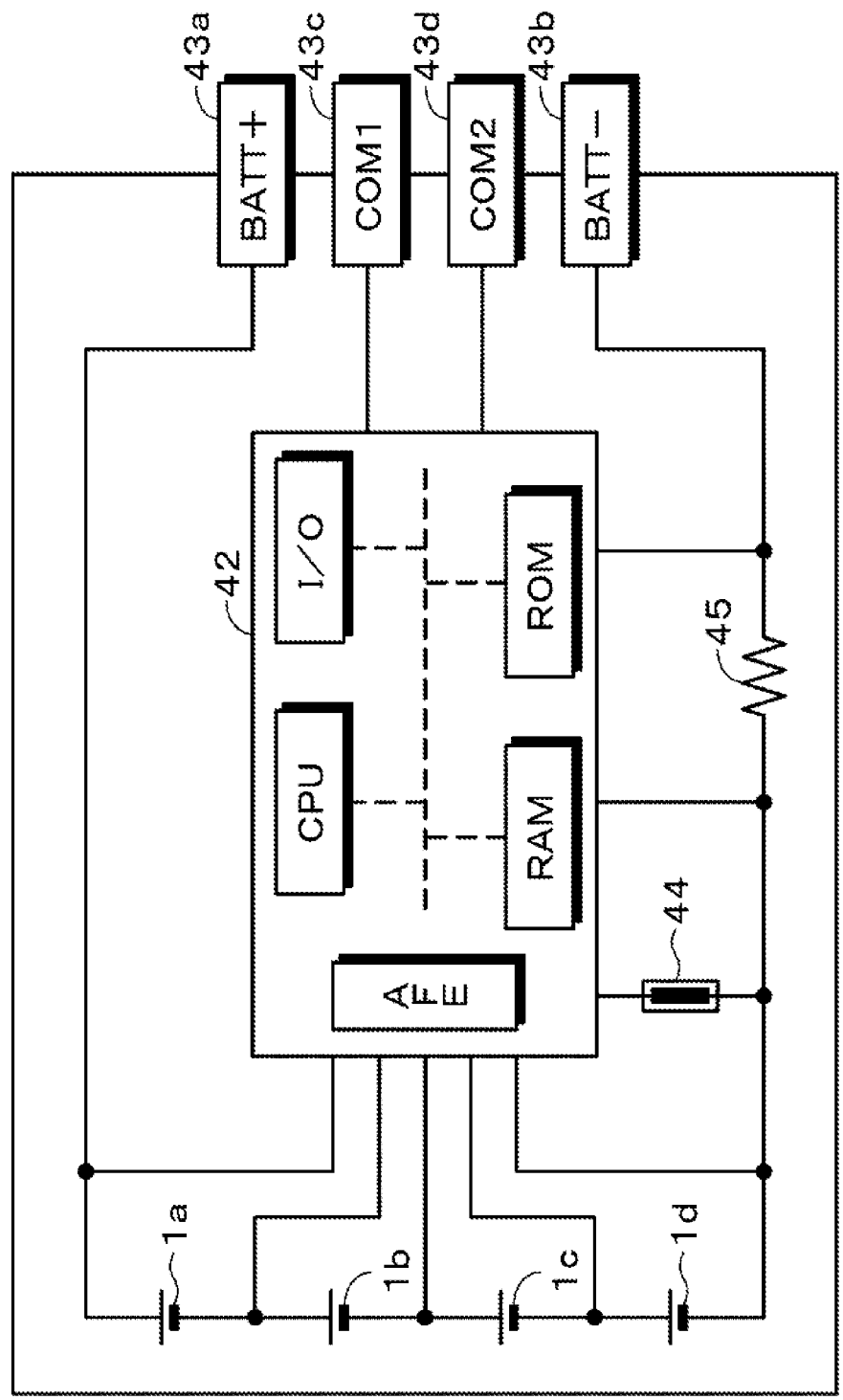
FIG. 12 is a block diagram illustrating an application example according to an embodiment of the present disclosure.

The present technology can be similarly applied to a battery pack including a battery in which a plurality of, for example, four battery cells 1a, 1b, 1c, and 1d are connected in series as illustrated in FIG. 12, and similar effects can be obtained.

Application Example 2 of the present technology is described.

The battery according to the embodiment of the present technology described above can be used, for example, for mounting or supplying power to a device such as an electronic device, an electric vehicle, or a power storage device. Examples of the electronic device include laptop computers, smartphones, tablet terminals, PDAs (personal digital terminals), mobile phones, wearable terminals, cordless handsets, video movies, digital still cameras, electronic books, electronic dictionaries, music players, radios, headphones, game consoles, navigation systems, memory cards, pacemakers, hearing aids, electric tools, electric shavers, refrigerators, air conditioners, TVs, stereos, water heaters, microwave ovens, dishwashers, washing machines, dryers, lighting devices, toys, medical devices, robots, road conditioners, and traffic lights.

Further, examples of the electric vehicle include a rail vehicle, a golf cart, an electric cart, and an electric car (including a hybrid car), and the battery according to the embodiment of the present technology is used as a driving power source or an auxiliary power source thereof. Examples of the power storage device include a power source for power storage for a building such as a house or for a power generation facility.

Figure 13:
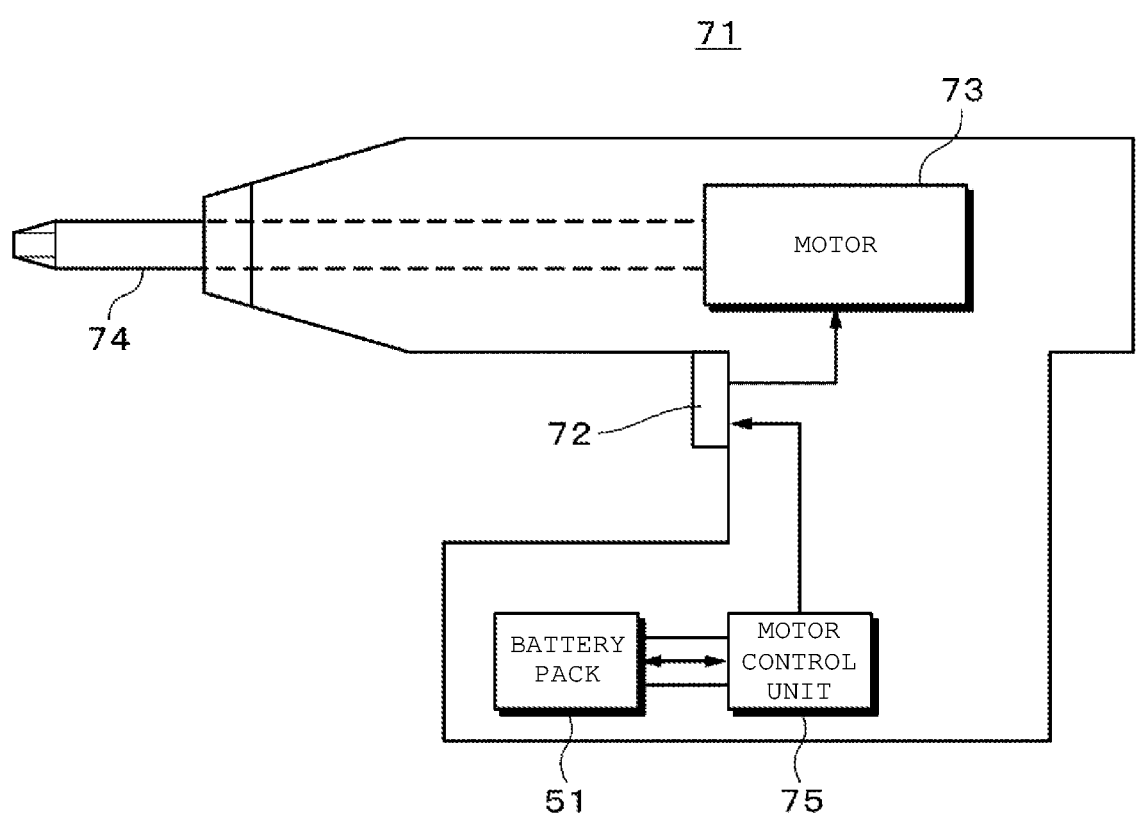
FIG. 13 is a schematic diagram illustrating an application example according to an embodiment of the present disclosure.

An example of an electric tool to which the present technology is applicable to, for example, an electric driver, is schematically described with reference to FIG. 13. In an electric driver 71, a motor 73 such as a DC motor is accommodated in the main body. The rotation of the motor 73 is transmitted to a shaft 74, and a screw is screwed onto an object by the shaft 74. The electric driver 71 includes a trigger switch 72 operated by a user.

The battery pack 51 and a motor control unit 75 are accommodated in a handle of the electric driver 71 at a lower part of a housing. The battery pack 51 according to the present technology can be used as the battery pack 51. The motor control unit 75 controls the motor 73. The components of the electric driver 71 other than the motor 73 may be controlled by the motor control unit 75. Although not illustrated, the battery pack 51 and the electric driver 71 are engaged by engaging members provided on each. As described later, each of the battery pack 51 and the motor control unit 75 includes a microcomputer. Battery power is supplied from the battery pack 51 to the motor control unit 75, and information of the battery pack 51 is communicated between the two microcomputers.

The battery pack 51 is attachable to and detachable from the electric driver 71, for example. The battery pack 51 may be incorporated in the electric driver 71. The battery pack 51 is attached to the charging device at the time of charging. When the battery pack 51 is attached to the electric driver 71, a part of the battery pack 51 may be exposed to the outside of the electric driver 71 so that a user can visually recognize the exposed portion. For example, an LED may be provided on the exposed portion of the battery pack 51 so that a user can confirm light emission and extinguishment of the LED.

The motor control unit 75 controls, for example, the rotation/stop of the motor 73 and the direction of rotation. Furthermore, the power supply to the load is shut off at the time of overdischarging. The trigger switch 72 is inserted, for example, between the motor 73 and the motor control unit 75, and when a user presses the trigger switch 72, power is supplied to the motor 73 and the motor 73 rotates. When a user returns the trigger switch 72, the rotation of the motor 73 is stopped.

Figure 14:
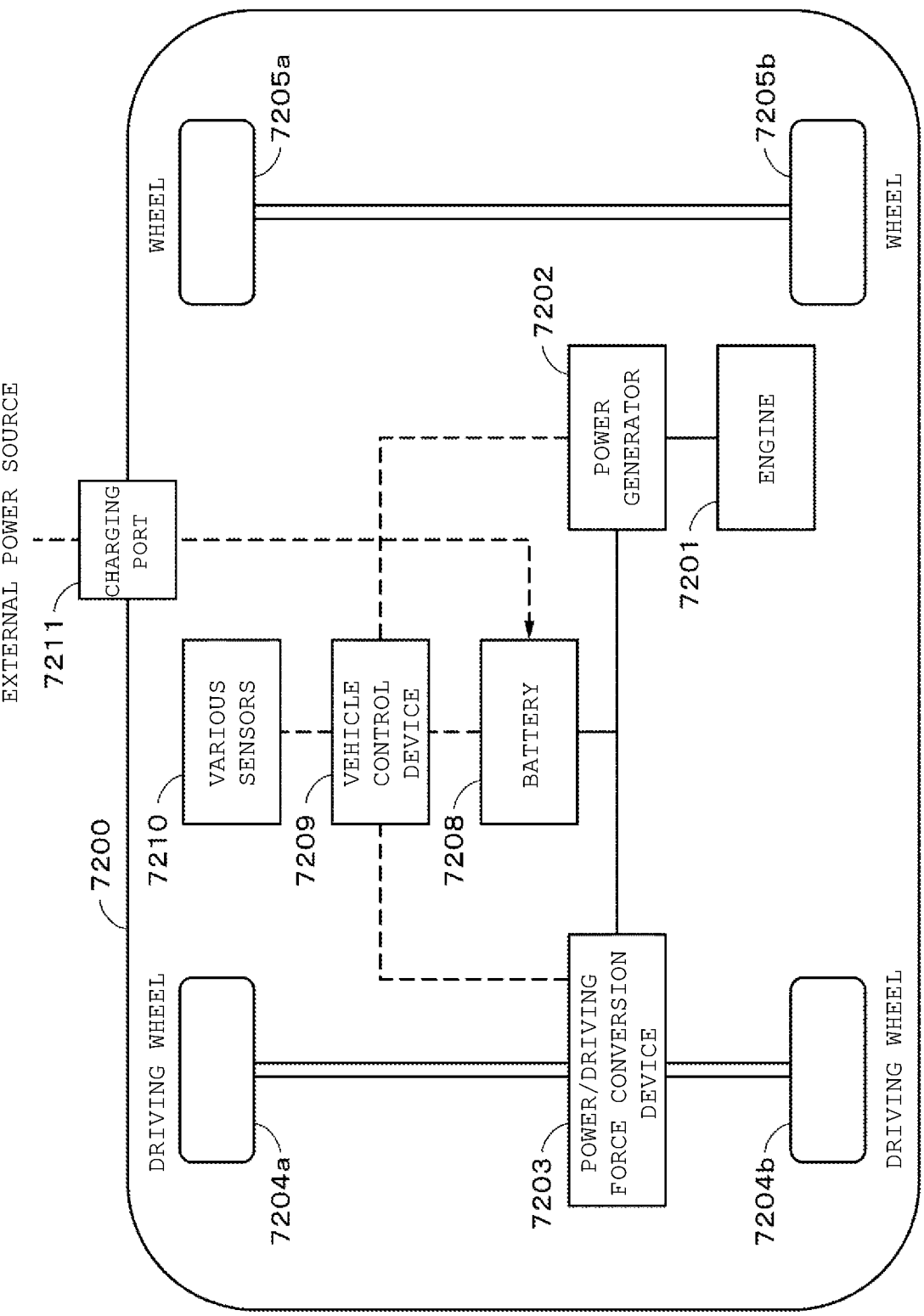
FIG. 14 is a schematic diagram illustrating an application example according to an embodiment of the present disclosure.

An example in which the present technology is applied to a power storage system for a vehicle is described with reference to FIG. 14. FIG. 14 schematically illustrates an example of a configuration of a hybrid vehicle that employs a series hybrid system to which the present technology is applied. The series hybrid system is a car that travels by a power drive conversion device using power generated by a power generator driven by an engine or power stored in a battery once.

In a hybrid vehicle 7200, there are mounted an engine 7201, a power generator 7202, a power/driving force conversion device 7203, a driving wheel 7204a, a driving wheel 7204b, a wheel 7205a, a wheel 7205b, a battery 7208, a vehicle control device 7209 (controller), various sensors 7210, and a charging port 7211. The power storage device of the present technology described above is applied to the battery 7208.

The hybrid vehicle 7200 travels using power/driving force conversion device 7203 as a power source. An example of the power/driving force conversion device 7203 (converter) is a motor. The power/driving force conversion device 7203 is operated by the power of the battery 7208, and the rotational force of the power/driving force conversion device 7203 is transmitted to the driving wheels 7204a and 7204b. By using DC-AC conversion or inverse conversion (AC-DC conversion) at necessary portions, the power/driving force conversion device 7203 is applicable to any of an AC motor or a DC motor. The various sensors 7210 control the engine speed via the vehicle control device 7209 (controller including a processor) and control the opening degree of a throttle valve (not shown) (throttle opening degree). The various sensors 7210 include a speed sensor, an acceleration sensor, an engine speed sensor, and the like.

The rotational power of the engine 7201 is transmitted to the power generator 7202, and the power generated by the power generator 7202 can be stored in the battery 7208.

When the hybrid vehicle is decelerated by a braking mechanism (not shown), a resistance at the time of deceleration is applied as a rotational force to the power/driving force conversion device 7203, and by the rotational force, the regenerative power generated by the power/driving force conversion device 7203 is accumulated in the battery 7208.

By being connected to a power source outside the hybrid vehicle, the battery 7208 can receive power supply from the external power source using the charging port 7211 as an input port, and store the received power.

Although not illustrated, an information processing device that performs information processing related to vehicle control based on information related to the secondary battery may be provided. Examples of such an information processing device include, for example, an information processing device that displays a battery remaining amount based on information related to a battery remaining amount.

In the above, description is given taking, as an example, the series hybrid vehicle that travels by the motor using power generated by the power generator driven by the engine or power stored in the battery once. However, present technology is effectively applicable to a parallel hybrid vehicle that uses the engine and the motor outputs as drive sources, and uses three methods of traveling only by the engine, traveling only by the motor, and traveling by the engine and motor while appropriately switching these. Furthermore, present technology is effectively applicable to a so-called electric vehicle that travels by driving only by a drive motor without using an engine.

The example of the hybrid vehicle 7200 to which the technology according to the present technology may be applied has been described above. The technology according to the present technology may be suitably applied to, for example, the battery 7208 among the configurations described above. Specifically, the lithium ion secondary battery 1 is applied to the battery 7208.

Figure 15:
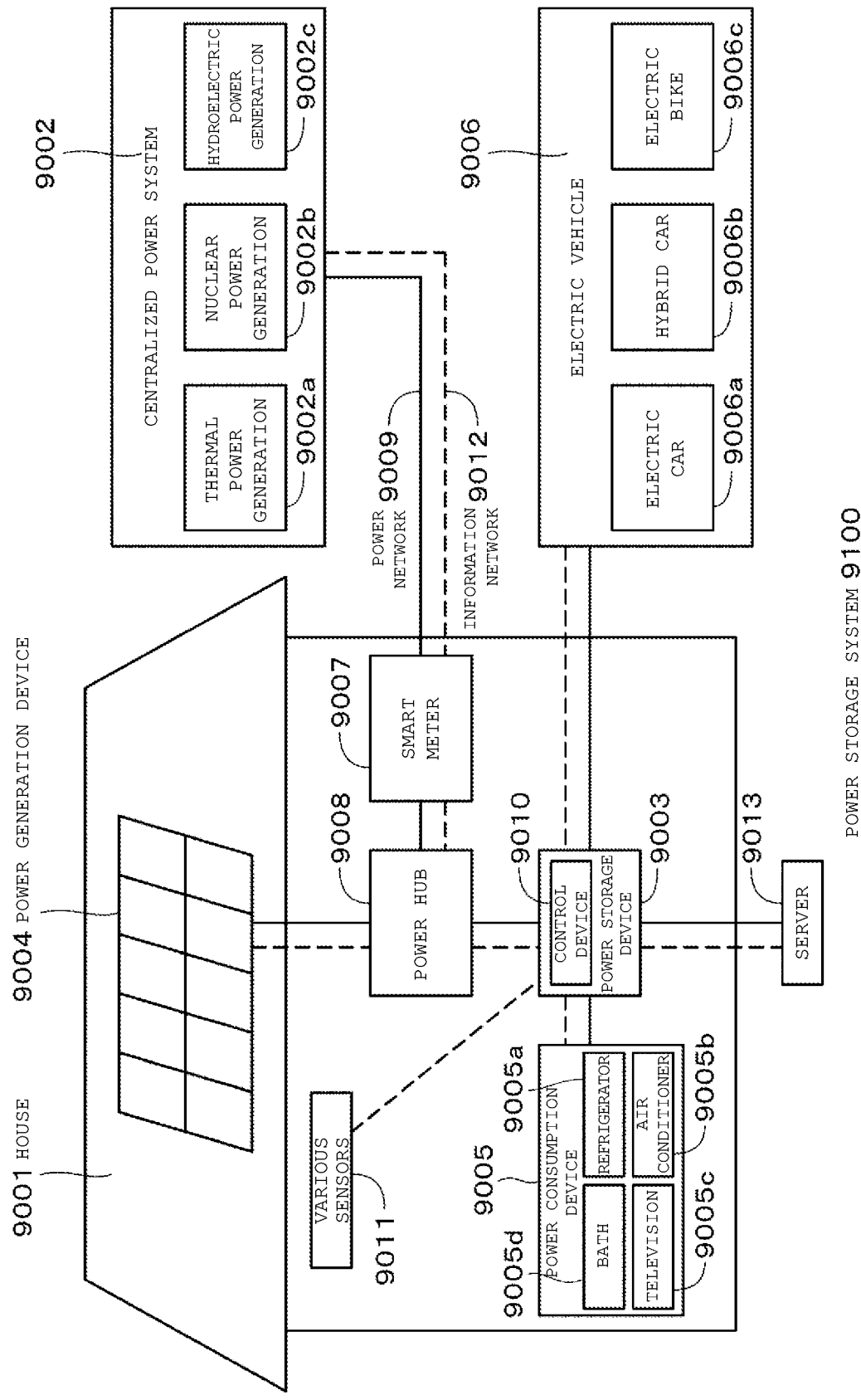
FIG. 15 is a schematic diagram illustrating an application example according to an embodiment of the present disclosure.

An example in which the present technology is applied to a power storage system for a house is described with reference to FIG. 15. For example, in a power storage system 9100 for a house 9001, power is supplied to a power storage device 9003 from a centralized power system 9002 such as thermal power generation 9002a, nuclear power generation 9002b, hydroelectric power generation 9002c, and the like to a power network 9009, an information network 9012, a smart meter 9007, a power hub 9008, and the like. At the same time, power is supplied to the power storage device 9003 from an independent power source such as a home power generation device 9004. Power supplied to the power storage device 9003 is stored. The power storage device 9003 is used to supply power used in the house 9001. The similar power storage system can be used not only for the house 9001 but also for a building.

The house 9001 includes a power generation device 9004, a power consumption device 9005, the power storage device 9003, a control device 9010 (controller) that controls each device, a smart meter 9007, and a sensor 9011 that acquires various information. The respective devices are connected by a power network 9009 and an information network 9012. A solar cell, a fuel cell, or the like is used as the power generation device 9004, and the generated power is supplied to the power consumption device 9005 and/or the power storage device 9003. The power consumption device 9005 is a refrigerator 9005*a*, an air conditioner 9005*b*, a television receiver 9005*c*, a bath 9005*d*, or the like. Furthermore, the power consumption device 9005 includes an electric vehicle 9006. An electric vehicle 9006 is an electric car 9006*a*, a hybrid car 9006*b*, and an electric bike 9006*c*.

The battery unit of the present technology described above is applied to the power storage device 9003. The power storage device 9003 is configured of a secondary battery or a capacitor. For example, it is configured of a lithium ion battery. The lithium ion battery may be a stationary type or may be used in the electric vehicle 9006. The smart meter 9007 has a function of measuring the usage amount of commercial power and transmitting the measured usage amount to a power company. The power network 9009 may combine one or more of DC feed, AC feed, and non-contact feed.

The various sensors 9011 are, for example, a human sensor, an illuminance sensor, an object detection sensor, a power consumption sensor, a vibration sensor, a contact sensor, a temperature sensor, an infrared sensor, or the like. The information acquired by the various sensors 9011 is transmitted to the control device 9010. With the information from the sensor 9011, the state of the weather, the state of a person, and the like can be grasped, and the power consumption device 9005 can be automatically controlled to minimize energy consumption. Furthermore, the control device 9010 can transmit information related to the home 9001 to an external power company or the like via the Internet.

The power hub 9008 performs processing such as branching of power lines and DC/AC conversion. Examples of a communication method of the information network 9012 connected to the control device 9010 include a method using a communication interface such as a universal asynchronous receiver-transmitter (UART: transmission/reception circuit for asynchronous serial communication), and methods using Sensor Network by the wireless communication standard such as Bluetooth (registered trademark), ZigBee (registered trademark), and Wi-Fi. The Bluetooth (registered trademark) system is applied to multimedia communication, and can perform one-to-many connection communication. ZigBee uses the physical layer of Institute of Electrical and Electronics Engineers (IEEE) 802.15.4. IEEE 802.15.4 is a name of a short distance wireless network standard called Personal Area Network (PAN) or Wireless (W) PAN.

The control device 9010 is connected to an external server 9013. The server 9013 may be managed by any one of the house 9001, a power company, and a service provider. The information transmitted and received by the server 9013 is, for example, power consumption information, life pattern information, power rates, weather information, natural disaster information, and information on power transaction. These pieces of information may be transmitted and received by a home power consumption device (for example, a television receiver), but may be transmitted and received by a device outside the home (for example, a cellular phone or the like). These pieces of information may be displayed on a device having a display function, for example, a television receiver, a mobile phone, Personal Digital Assistants (PDA), or the like.

The control device 9010 that controls each unit is configured of a central processing unit (CPU) or processor, a random access memory (RAM), a read only memory (ROM), and the like, and is stored in the power storage device 9003 in this example. The control device 9010 is connected by the power storage device 9003, the home power generation device 9004, the power consumption device 9005, the various sensors 9011, the server 9013, and the information network 9012, and has a function to adjust, for example, the usage amount of commercial power and the power generation amount. In addition, the control device 9010 may have a function to perform power transaction in the power market.

As described above, not only the power generated from the centralized power system 9002 such as the thermal power generation 9002*a*, the nuclear power generation 9002*b*, the hydroelectric power generation 9002*c*, but also the generated power of the home power generation device 9004 (solar power generation and solar power generation) can be stored in the power storage device 9003. Therefore, even if the power generated by the home power generation device 9004 fluctuates, control can be performed such that the amount of the generated power to be transmitted to the outside can be made constant or discharging as necessary. For example, the power obtained by solar power generation may be stored in the power storage device 9003, and late-night power with low charging may be stored in the power storage device 9003 at night so that the power stored by the power storage device 9003 may be discharged in a time zone where the charging in the daytime is high.

Although the example in which the control device 9010 is stored in the power storage device 9003 has been described in this example, the control device 9010 may be stored in the smart meter 9007 or may be configured alone. Furthermore, the power storage system 9100 may be used for a plurality of households in an apartment house, or may be used for a plurality of detached houses.

The example of the power storage system 9100 to which the technology according to the present technology may be applied has been described above. The technology according to the present technology may be suitably applied to the power storage device 9003 and the control device 9010 among the configurations described above. Specifically, the lithium ion secondary battery 1 can be applied to the power storage device 9003, and the charging device 101 can be applied to a part of the control device 9010.

The present technology is also applicable to an aircraft. Since an aircraft flies over at a high altitude, the use environment temperature of the battery module may be 0° C. or less. Such a case can be coped with by performing the above-described variable current discharging control. In addition, the present technology is applicable not only to a large electric vehicle and aircraft, but also to an electric motorcycle, an electric bicycle, an electric three-wheeled vehicle, an electric small flying vehicle (also referred to as drone and the like), and the like.

The present technology is also applicable to electronic devices (PC, smartphone, mobile phone, toy, and the like) in which a secondary battery may be used, and the present technology can be realized as an electronic device that receives supply of power from the lithium ion secondary battery described above.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A charging device, comprising:
   a voltage detection unit for detecting a secondary battery voltage;
   a current detection unit for detecting a secondary battery current;
   a control unit receiving a detection signal of the voltage detection unit and the current detection unit to control charging voltage/charging current; and
   a DC/DC converter that is controlled by the control unit to supply current to the secondary battery,
   wherein the charging device switches to a (n+1)-th charging rate from a n-th charging rate when constant current charging is performed on a secondary battery at the n-th charging rate, at a state of charge (SOC) of the secondary battery, of 0.8 times or more and 0.9 times or less of an SOC at which a voltage local minimum value appears according to an environmental temperature at start of charging when an experimental battery having a same type of negative electrode and electrolytic solution as the secondary battery and metallic lithium is charged at the n-th charging rate,
   wherein the (n+1)-th charging rate is lower than the n-th charging rate, and n is a natural number, and
   wherein, when the SOC of the secondary battery is 80% or more of the SOC of the experimental battery at which the voltage local minimum value appears, the charging device charges at the n-th charging rate until full charging without switching from the n-th charging rate to the (n+1)-th charging rate.

2. A power storage device comprising:
   the charging device according to claim 1; and
   the secondary battery,
   wherein the power storage device is configured to supply power to an electronic device connected to the secondary battery.

3. A power storage system comprising:
   the charging device according to claim 1; and
   the secondary battery,
   wherein a power storage device is configured to receive power from the secondary battery.

4. The charging device according to claim 1, wherein the voltage local minimum value is a value of a voltage when a slope of the voltage is zero.

5. A charging method, comprising:
   detecting a secondary battery voltage via a voltage detection unit;
   detecting a secondary battery current via a current detection unit;
   receiving a detection signal of the voltage detection unit and the current detection unit to control charging voltage/charging current;
   controlling a DC/DC converter to supply current to the secondary battery; and
   switching a secondary battery to a (n+1)-th charging rate from a n-th charging rate when constant current charging is performed on the secondary battery at the n-th charging rate, at a state of charge (SOC) of the secondary battery, of 0.8 times or more and 0.9 times or less of an SOC at which a voltage local minimum value appears according to an environmental temperature at start of charging when an experimental battery having a same type of negative electrode and electrolytic solution as the secondary battery and metallic lithium is charged at the n-th charging rate,
   wherein the (n+1)-th charging rate is lower than the n-th charging rate, and n is a natural number, and
   wherein, when the SOC of the secondary battery is 80% or more of the SOC of the experimental battery at which the voltage local minimum value appears, the charging device charges at the n-th charging rate until full charging without switching from the n-th charging rate to the (n+1)-th charging rate.

* * * * *